United States Patent
Lin et al.

(10) Patent No.: US 12,205,849 B2
(45) Date of Patent: Jan. 21, 2025

(54) SEMICONDUCTOR DEVICE STRUCTURE WITH SOURCE/DRAIN STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Hou-Ju Li, Hsinchu (TW); Chun-Jun Lin, Hsinchu (TW); Yi-Fang Pai, Hsinchu (TW); Kuo-Hua Pan, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 17/824,249

(22) Filed: May 25, 2022

(65) Prior Publication Data

US 2023/0386935 A1  Nov. 30, 2023

(51) Int. Cl.
| | | |
|---|---|---|
| *H01L 29/66* | (2006.01) | |
| *H01L 21/02* | (2006.01) | |
| *H01L 21/8238* | (2006.01) | |
| *H01L 27/092* | (2006.01) | |
| *H01L 29/06* | (2006.01) | |

(Continued)

(52) U.S. Cl.
CPC ........ *H01L 21/823814* (2013.01); *H01L 21/02603* (2013.01); *H01L 21/823807* (2013.01); *H01L 21/823821* (2013.01); *H01L 27/0924* (2013.01); *H01L 29/0673* (2013.01); *H01L 29/0847* (2013.01); *H01L 29/42392* (2013.01); *H01L 29/66439* (2013.01); *H01L 29/66742* (2013.01); *H01L 29/66795* (2013.01);

(Continued)

(58) Field of Classification Search
CPC ....... H01L 21/823814; H01L 21/02603; H01L 21/823807; H01L 21/823821; H01L 27/0924; H01L 29/0673; H01L 29/0847; H01L 29/42392; H01L 29/66439; H01L 29/66742; H01L 29/66795; H01L 29/775; H01L 29/7851; H01L 29/78618; H01L 29/78696; H01L 29/165; H01L 29/7848; H01L 29/66545; B82Y 10/00
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |

(Continued)

*Primary Examiner* — Elias Ullah
(74) *Attorney, Agent, or Firm* — Birch, Stewart, Kolasch & Birch, LLP

(57) ABSTRACT

A method for forming a semiconductor device structure is provided. The method includes providing a substrate having a base, a first fin, and a second fin over the base. The method includes forming a gate stack over the first fin and the second fin. The method includes forming a first spacer over gate sidewalls of the gate stack and a second spacer adjacent to the second fin. The method includes partially removing the first fin and the second fin. The method includes forming a first source/drain structure and a second source/drain structure in the first trench and the second trench respectively. A first ratio of a first height of the first merged portion to a second height of a first top surface of the first source/drain structure is greater than or equal to about 0.5.

20 Claims, 28 Drawing Sheets

(51) Int. Cl.
*H01L 29/08* (2006.01)
*H01L 29/423* (2006.01)
*H01L 29/775* (2006.01)
*H01L 29/78* (2006.01)
*H01L 29/786* (2006.01)

(52) U.S. Cl.
CPC ........ *H01L 29/775* (2013.01); *H01L 29/7851* (2013.01); *H01L 29/78618* (2013.01); *H01L 29/78696* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

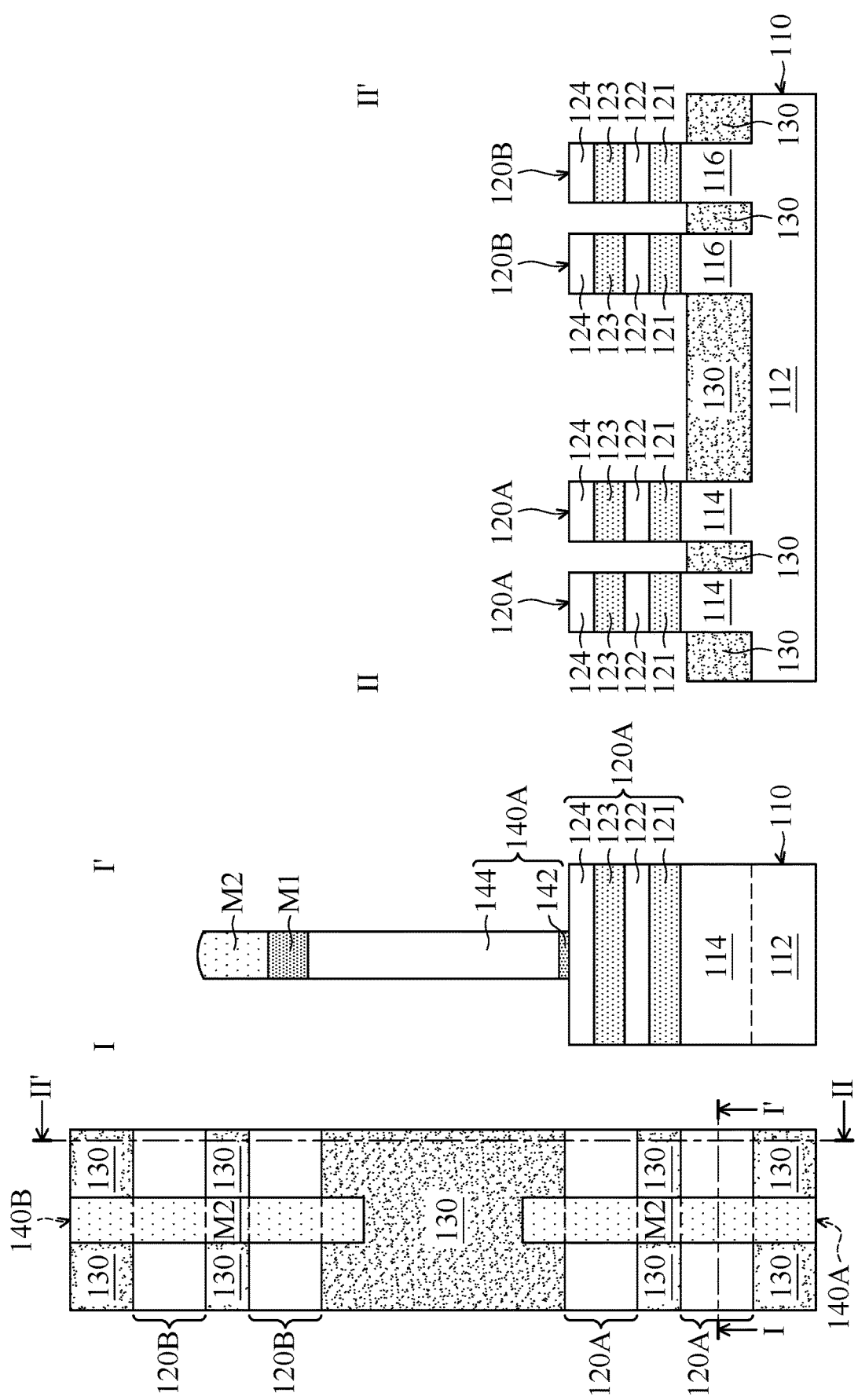

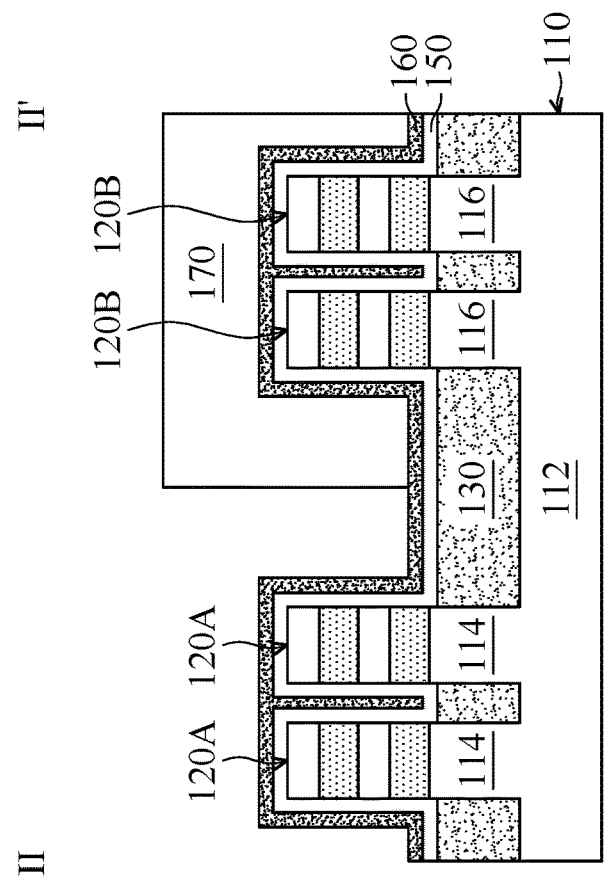
FIG. 2B-2
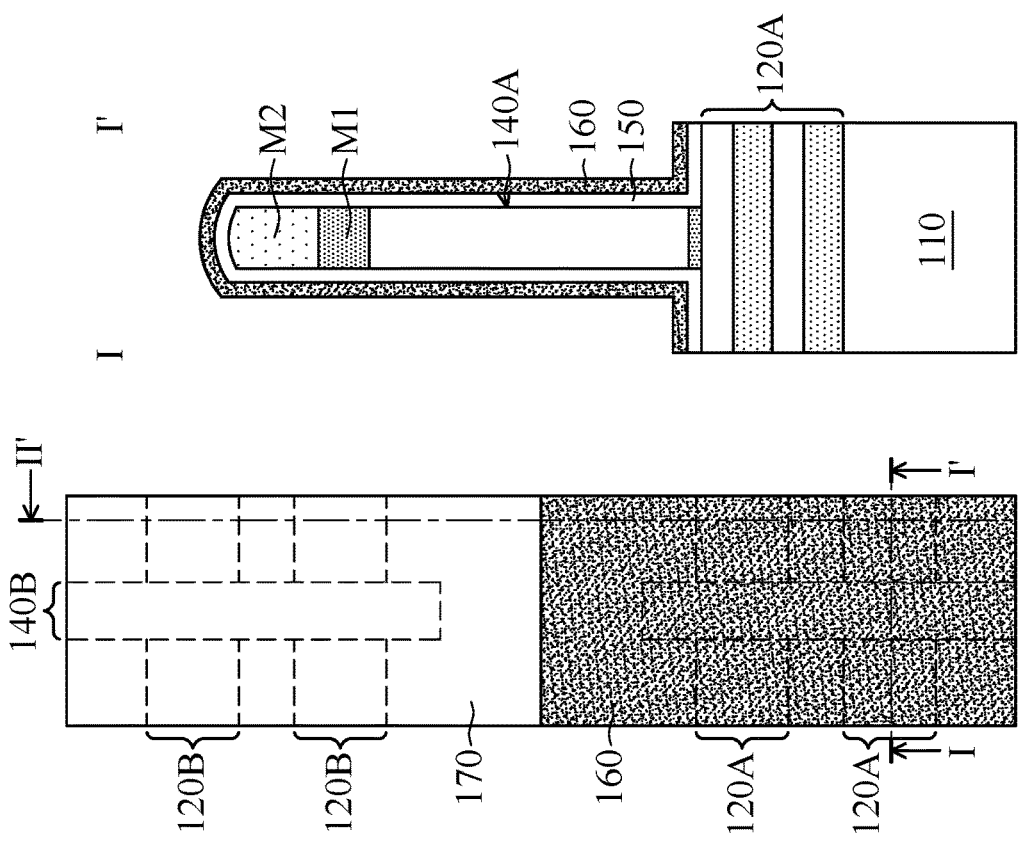
FIG. 2B-1
FIG. 2B

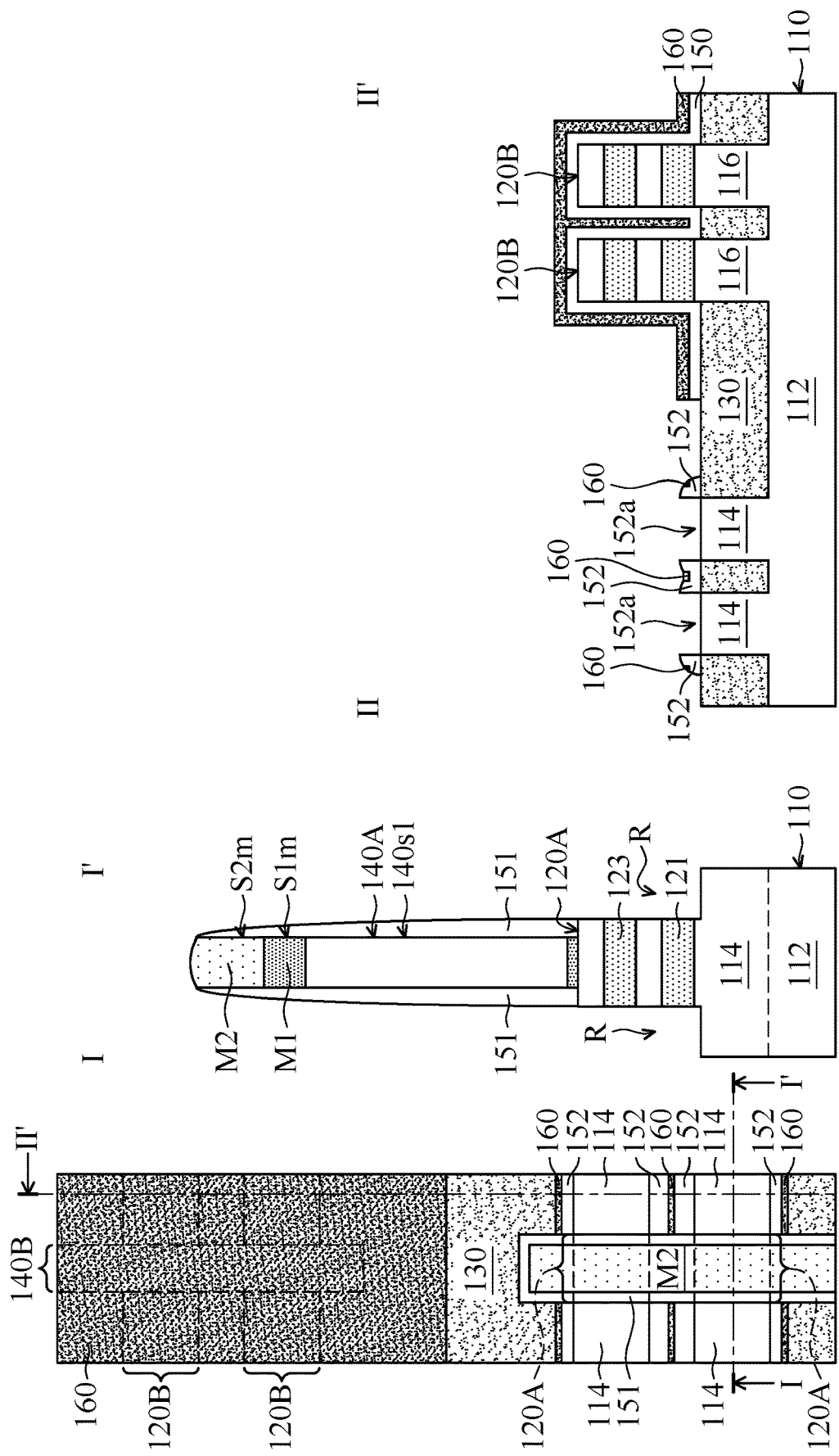

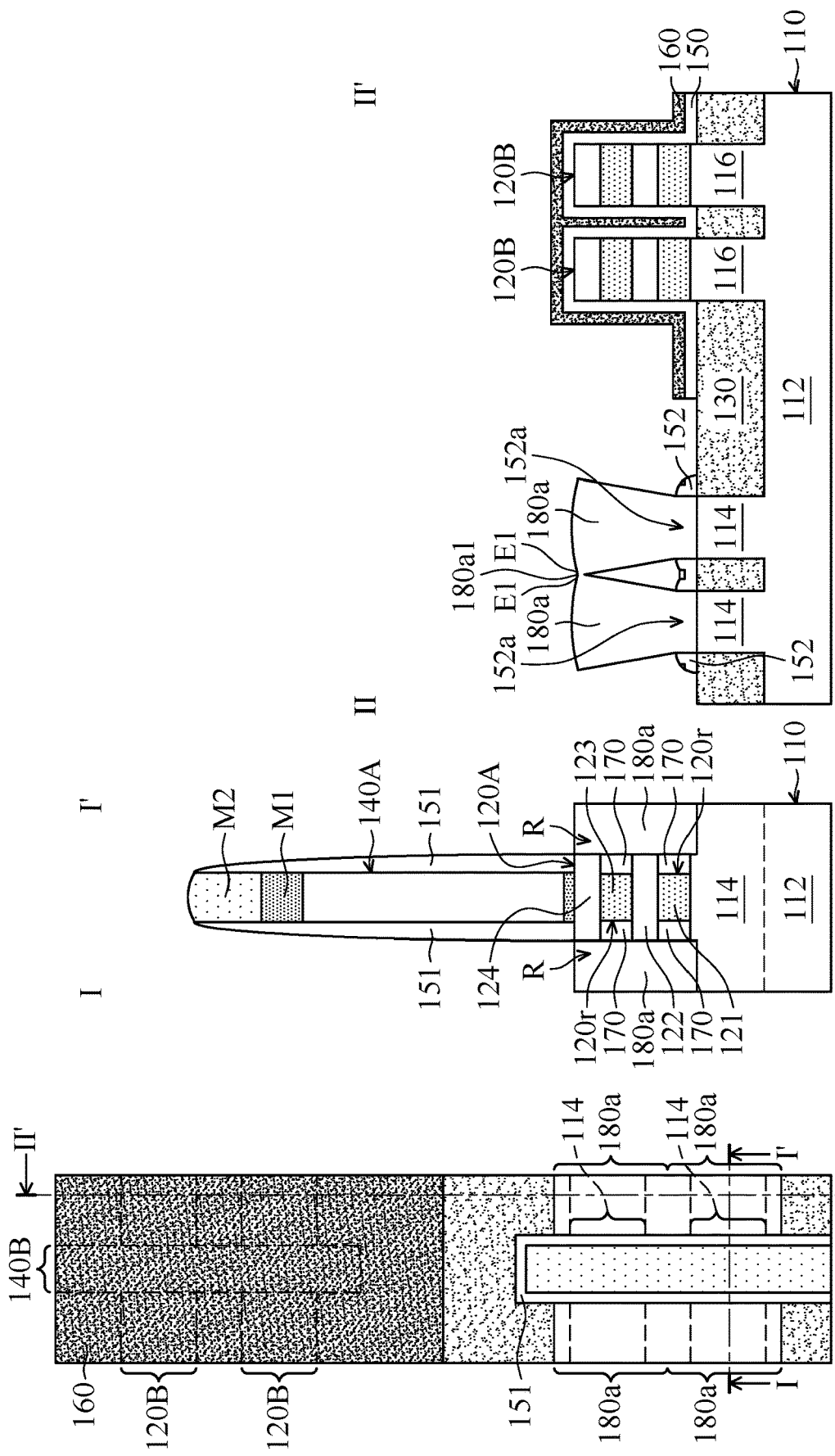

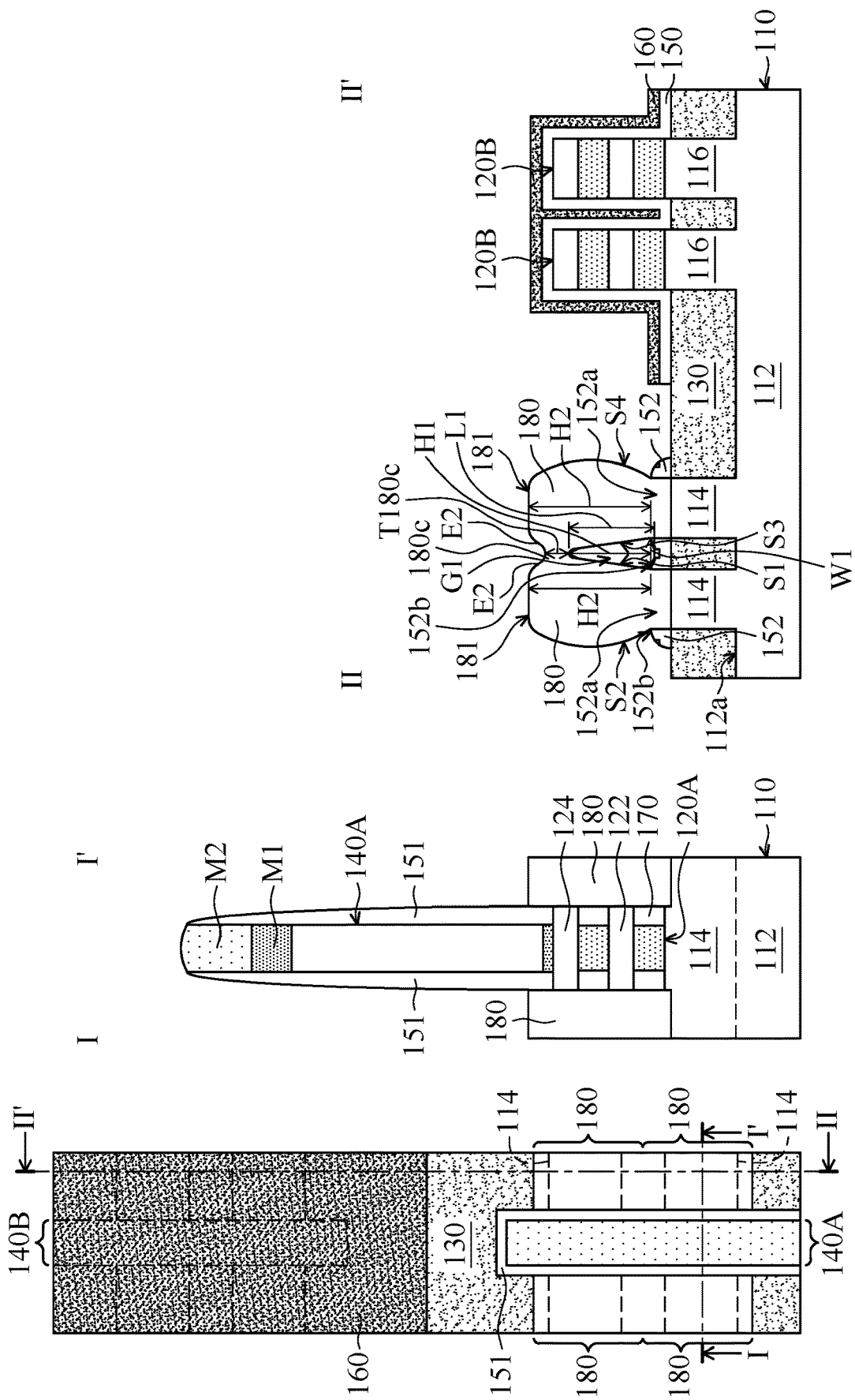

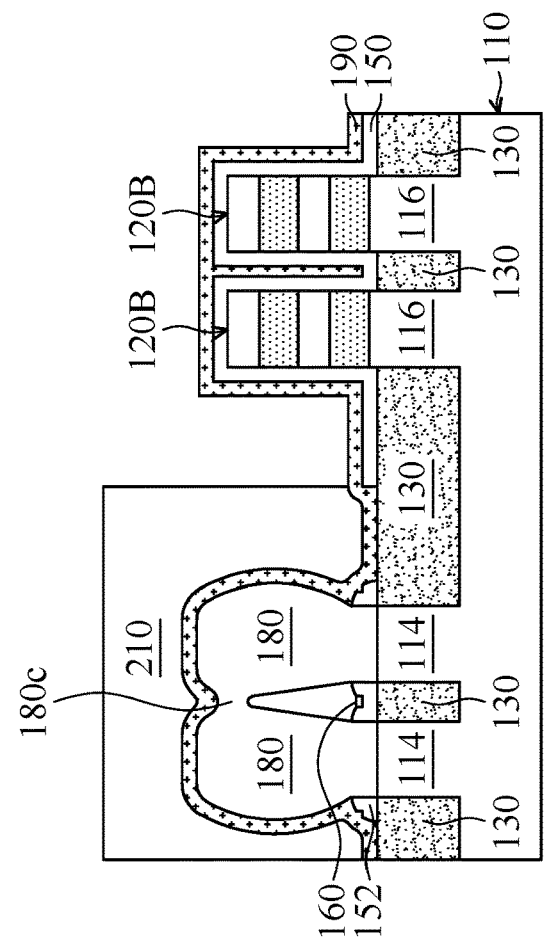
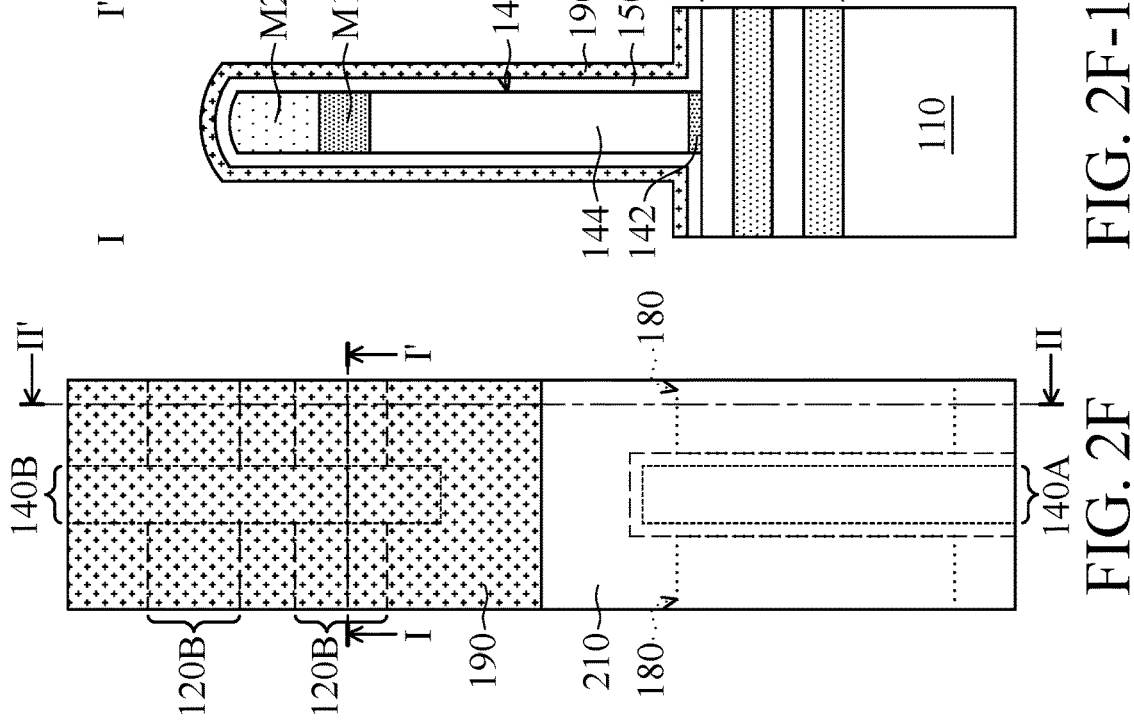
FIG. 2F-1   FIG. 2F-2
FIG. 2F

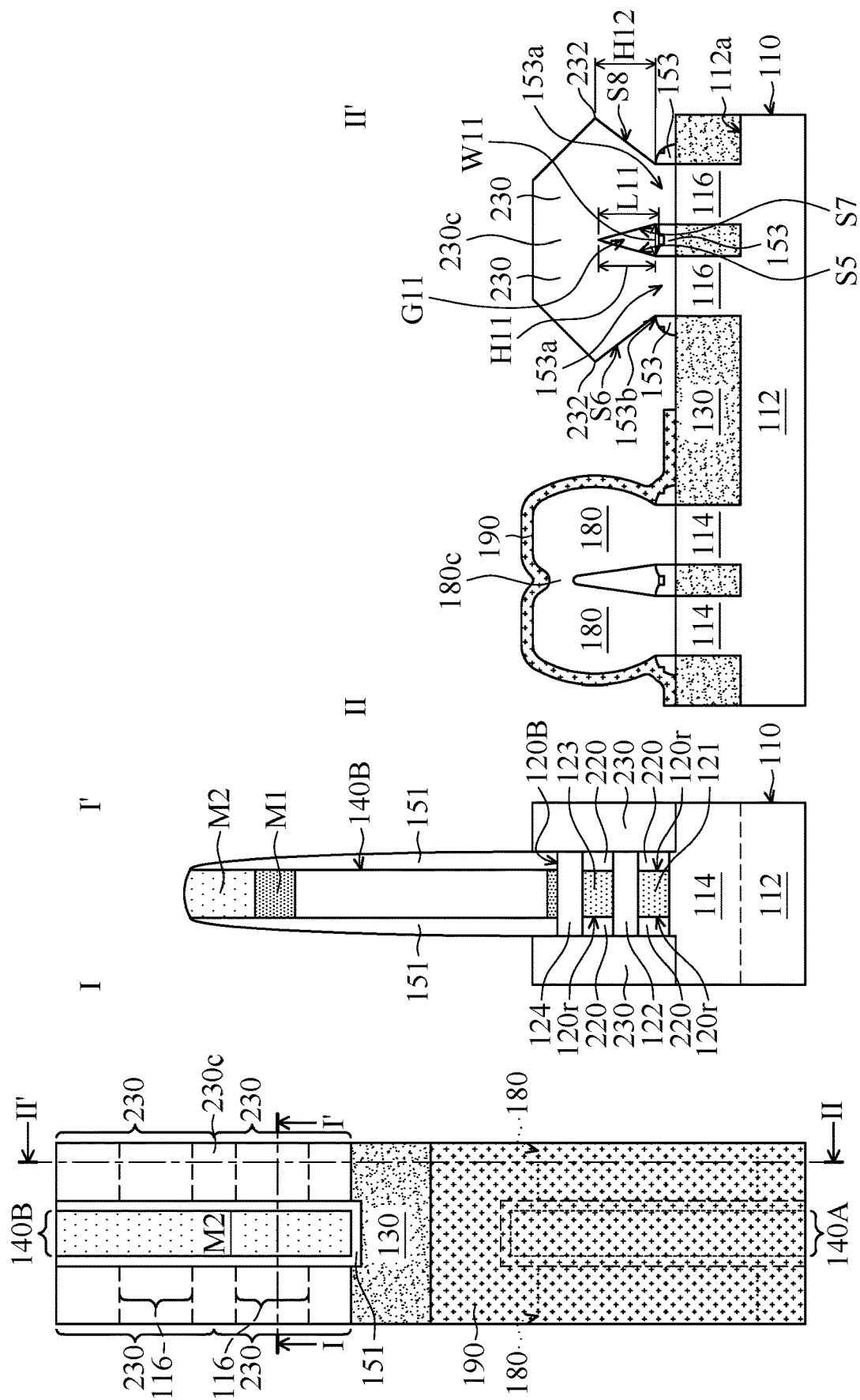

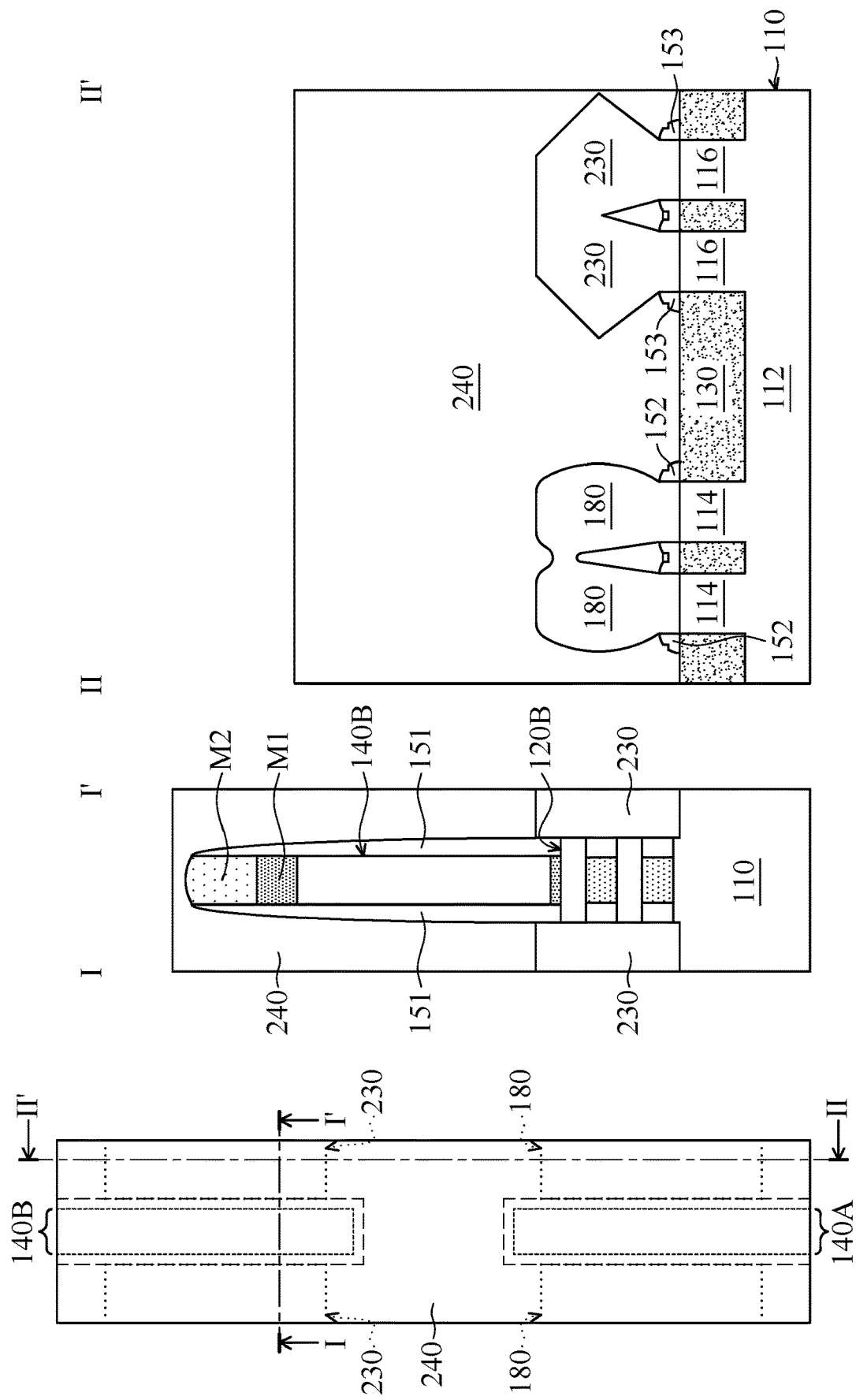

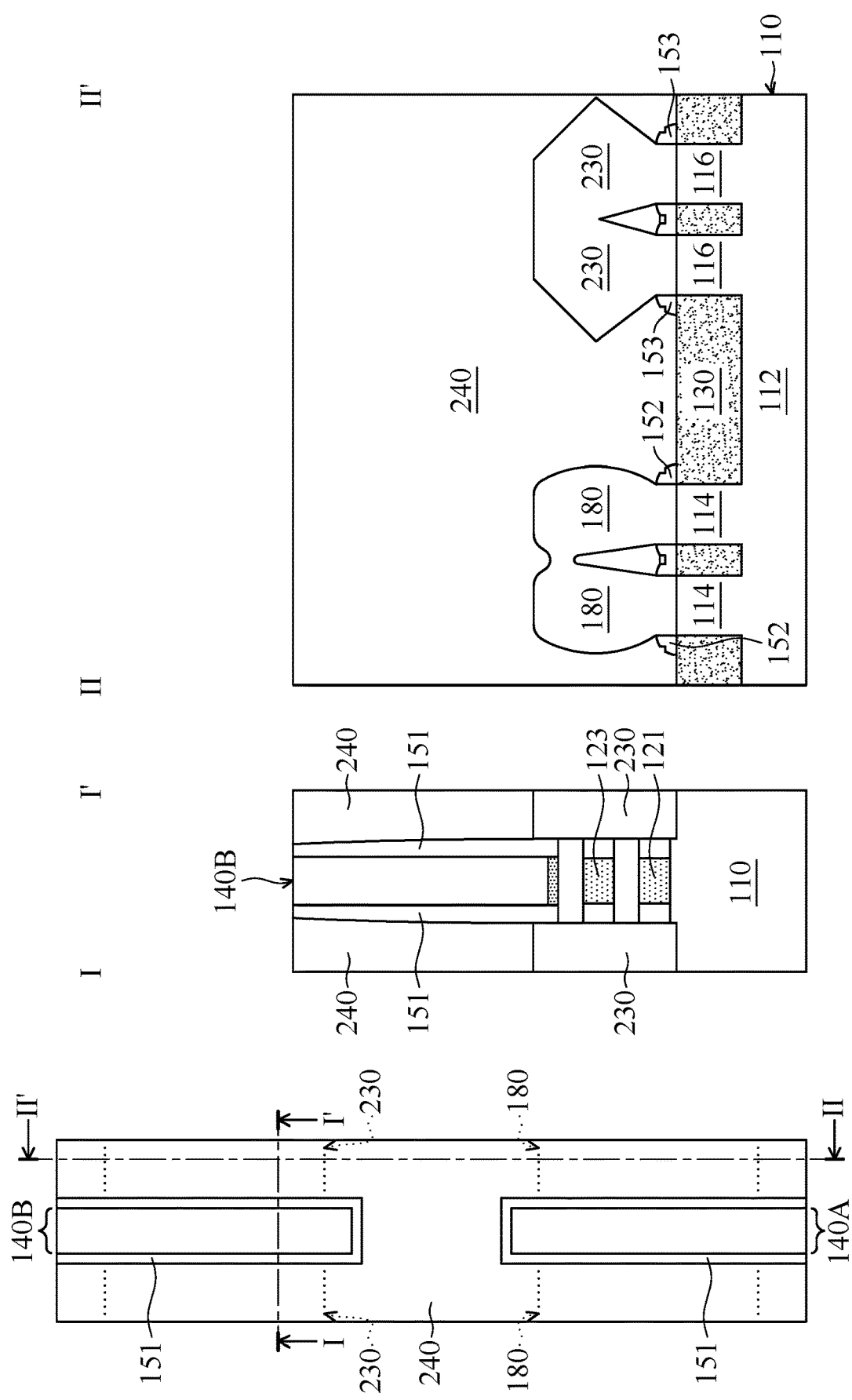

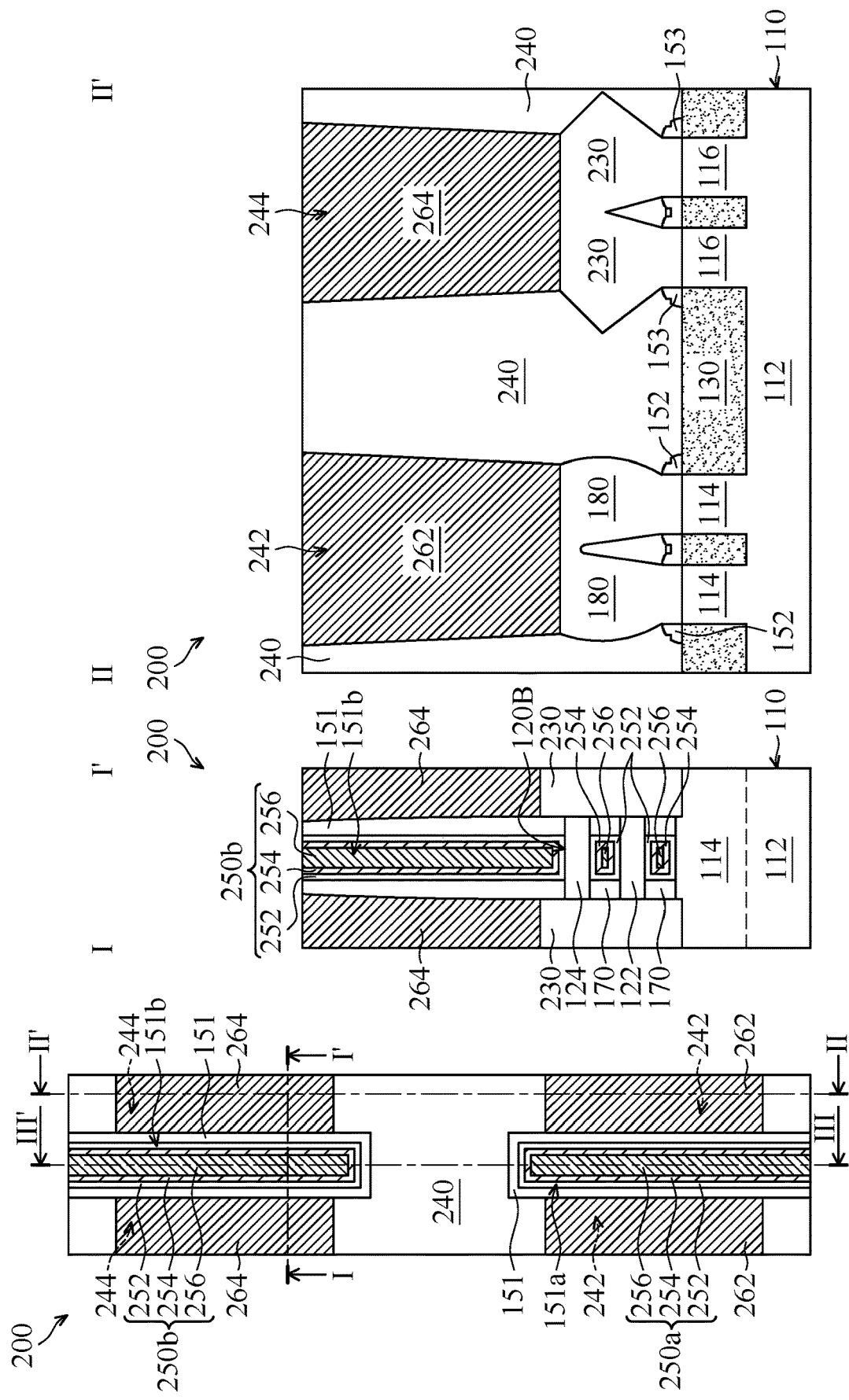

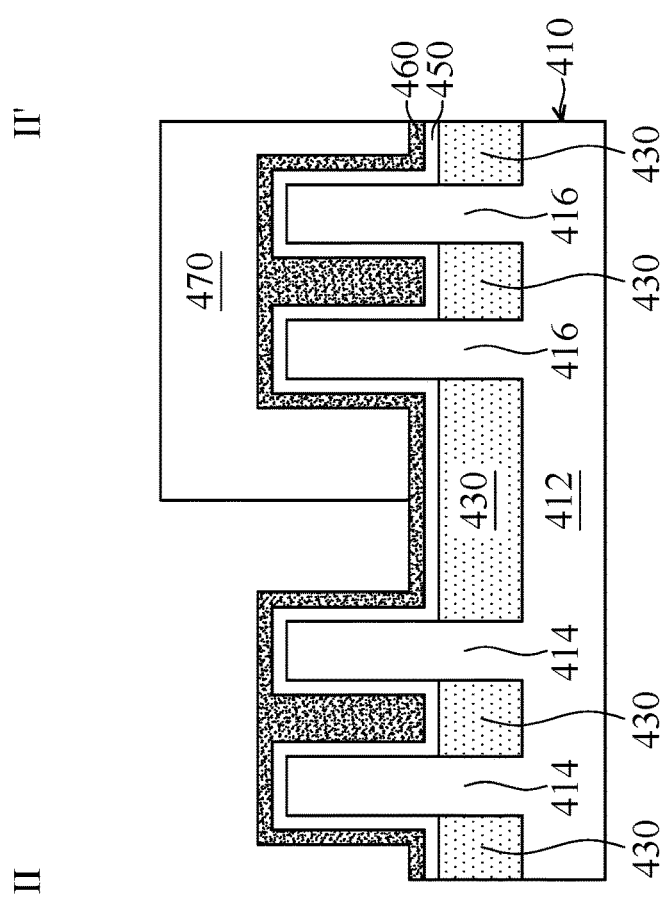
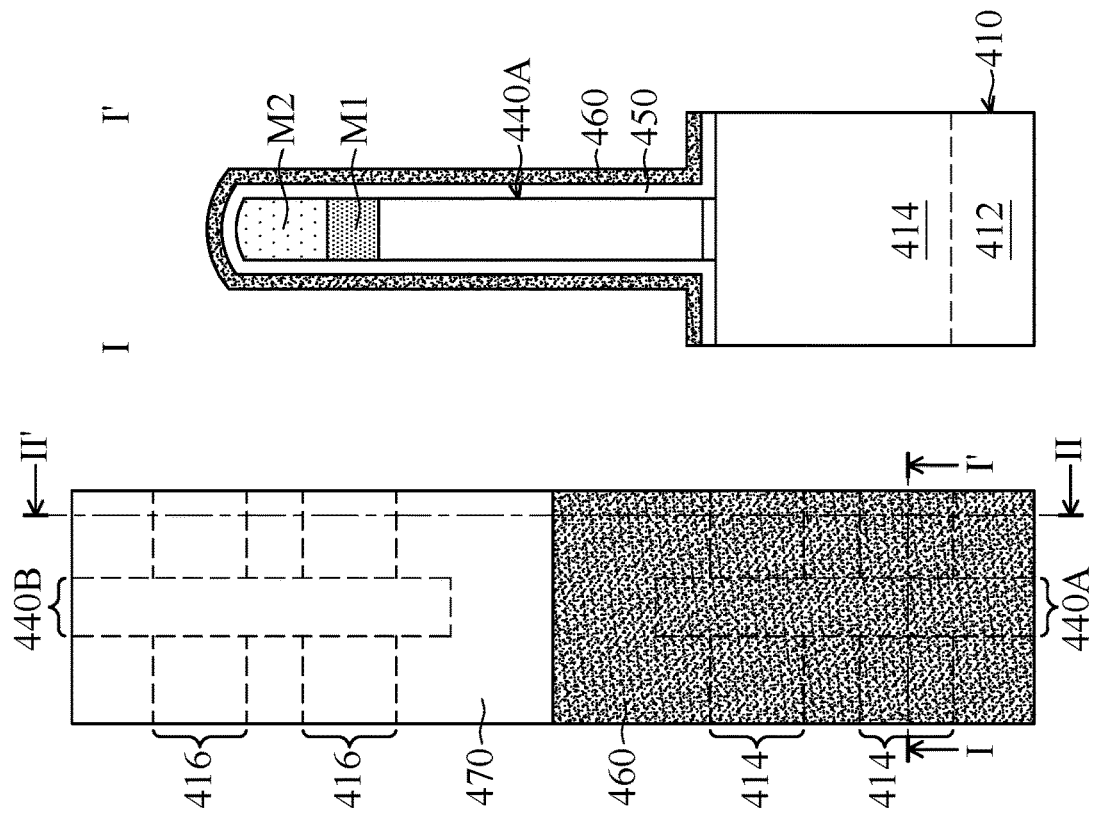
FIG. 5B
FIG. 5B-1
FIG. 5B-2

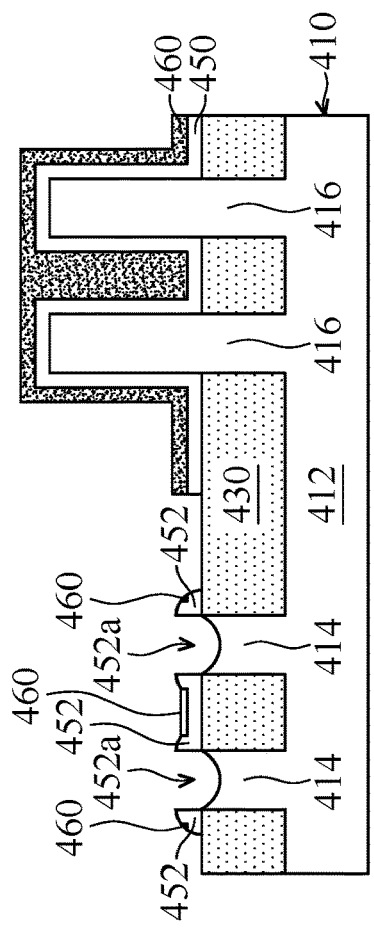
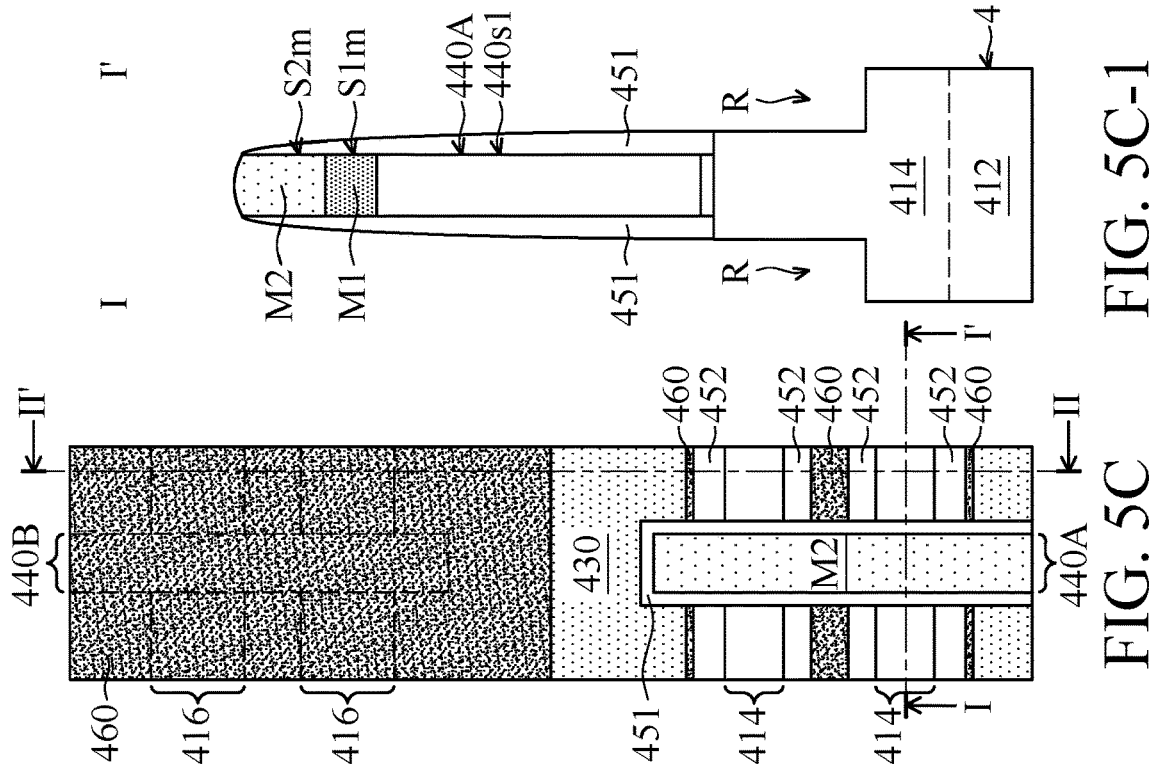

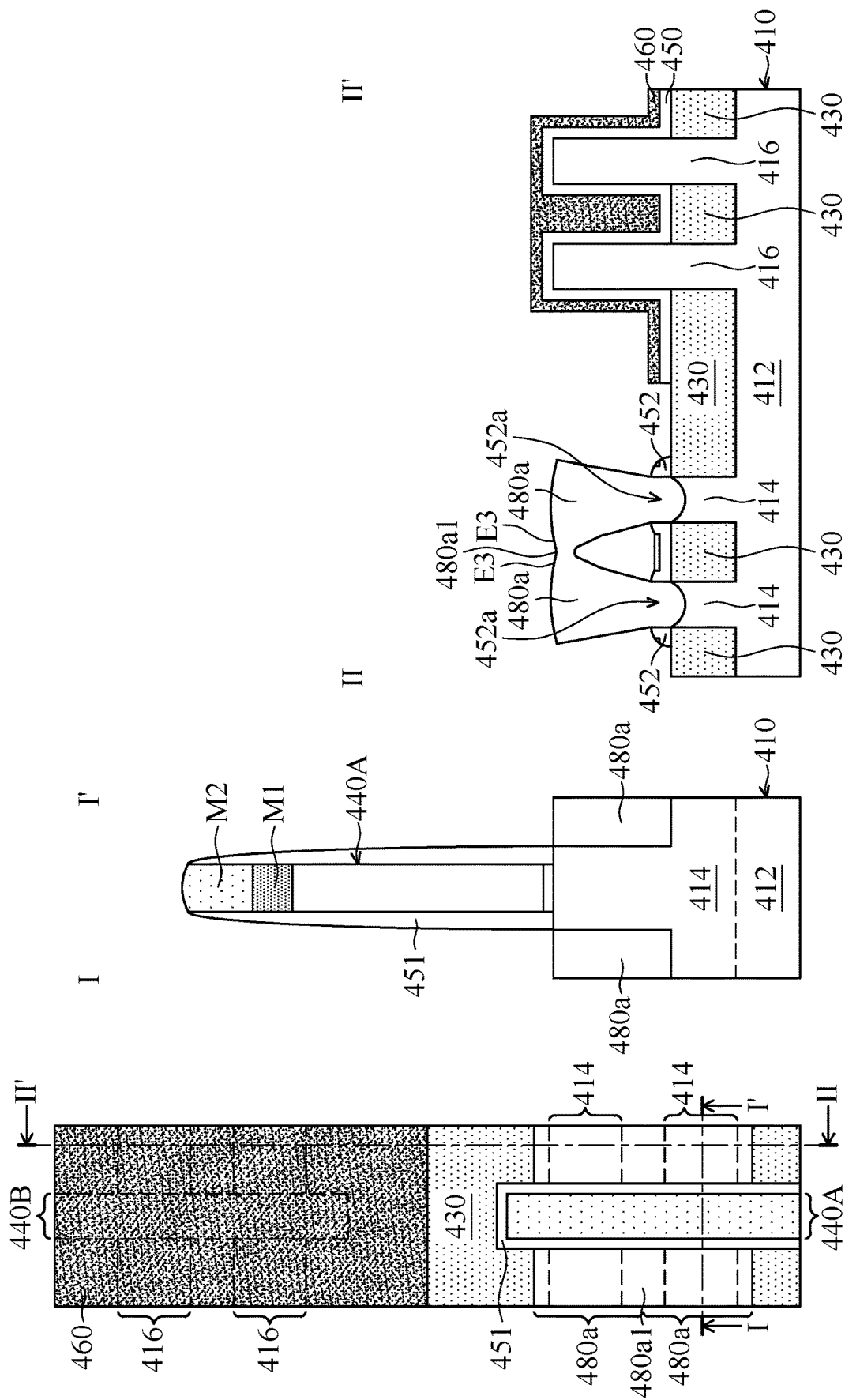

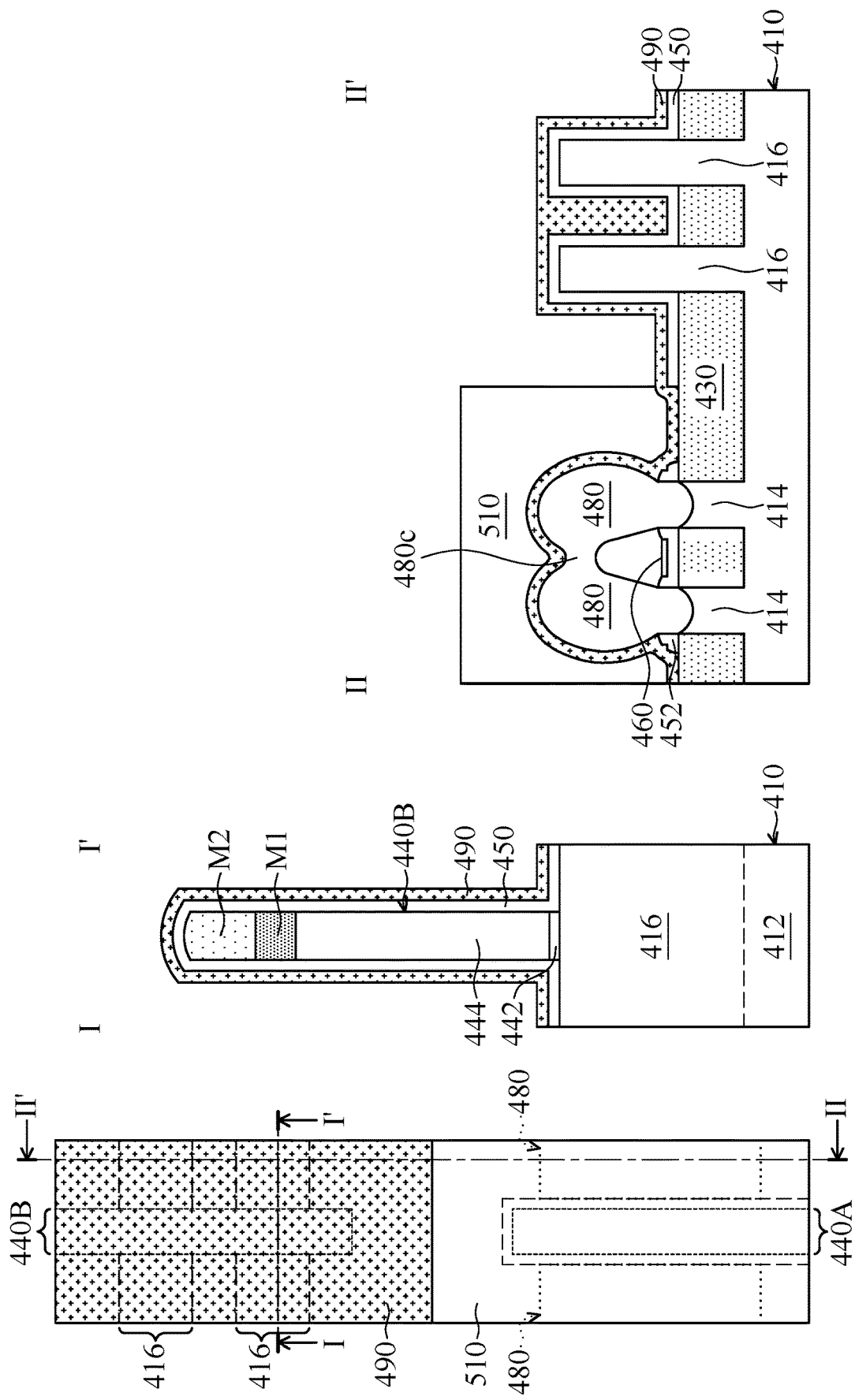

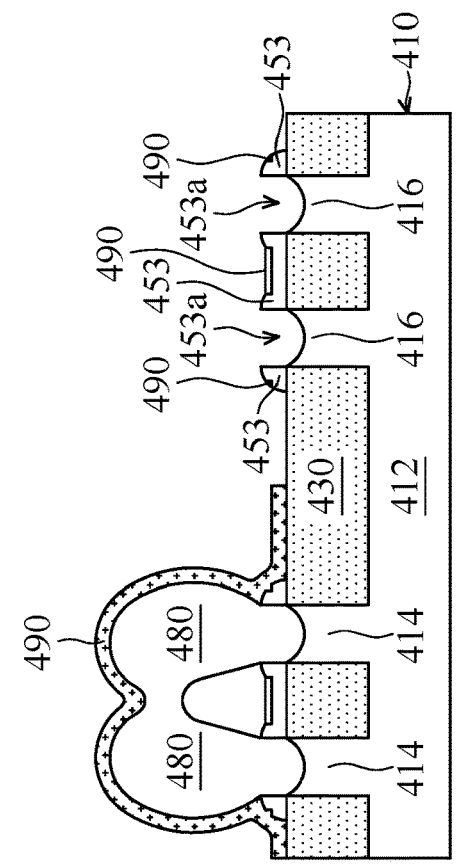
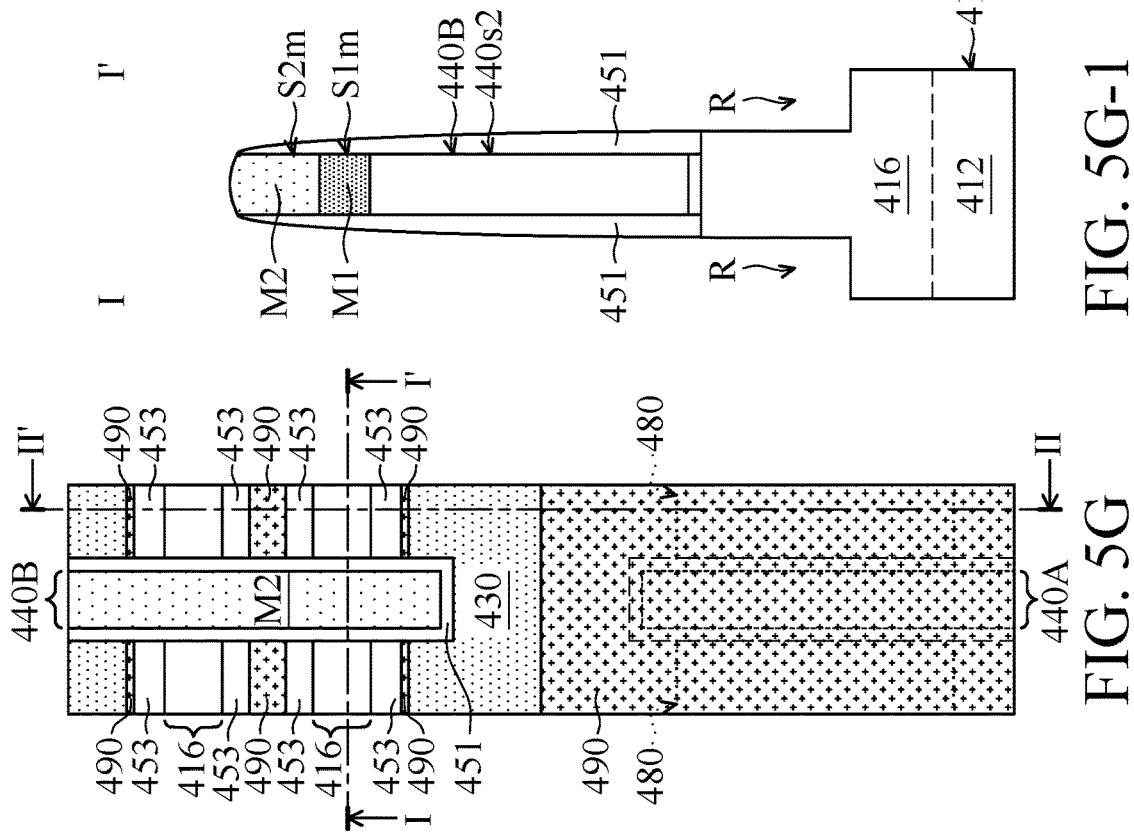
FIG. 5G-1
FIG. 5G-2
FIG. 5G

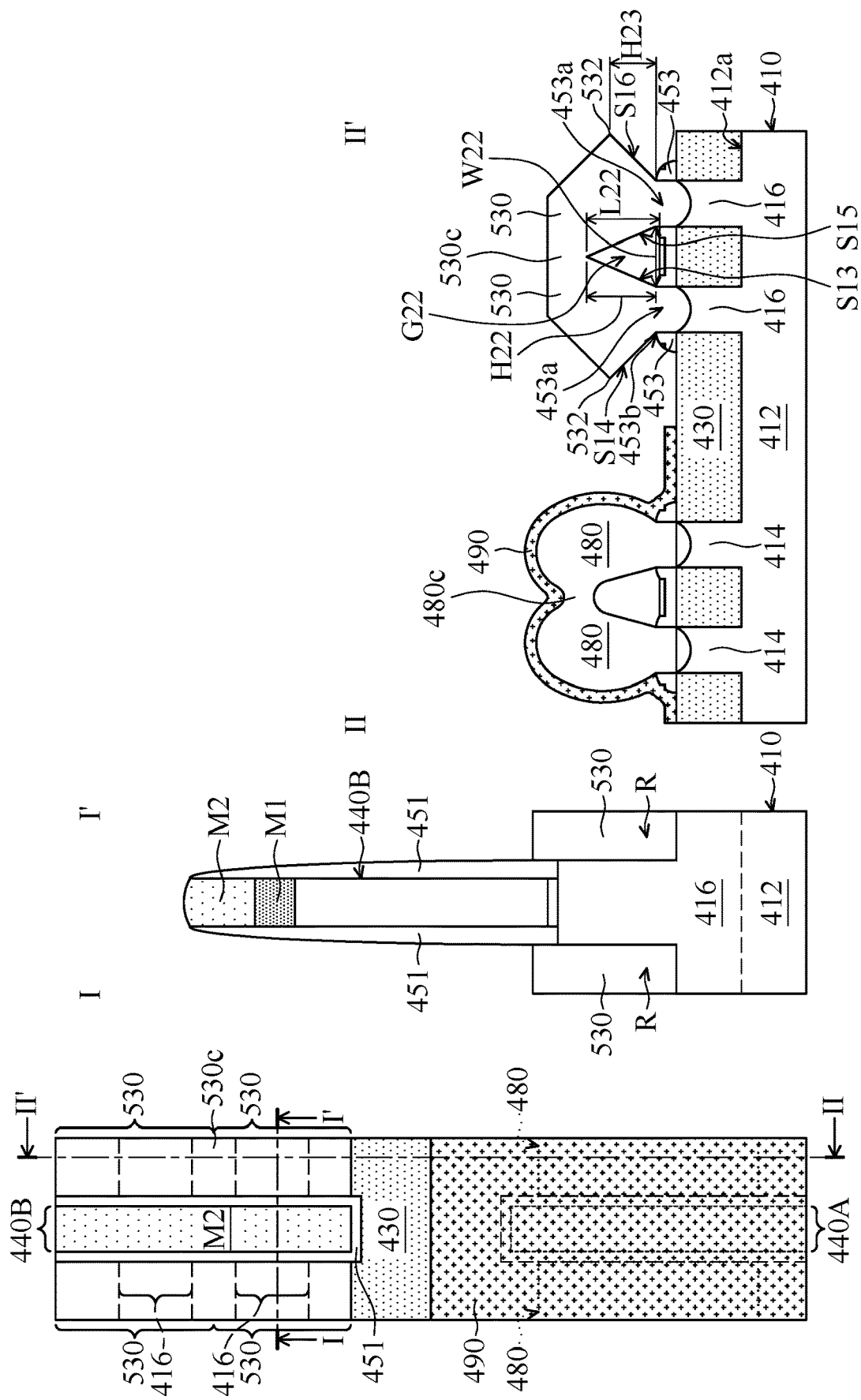

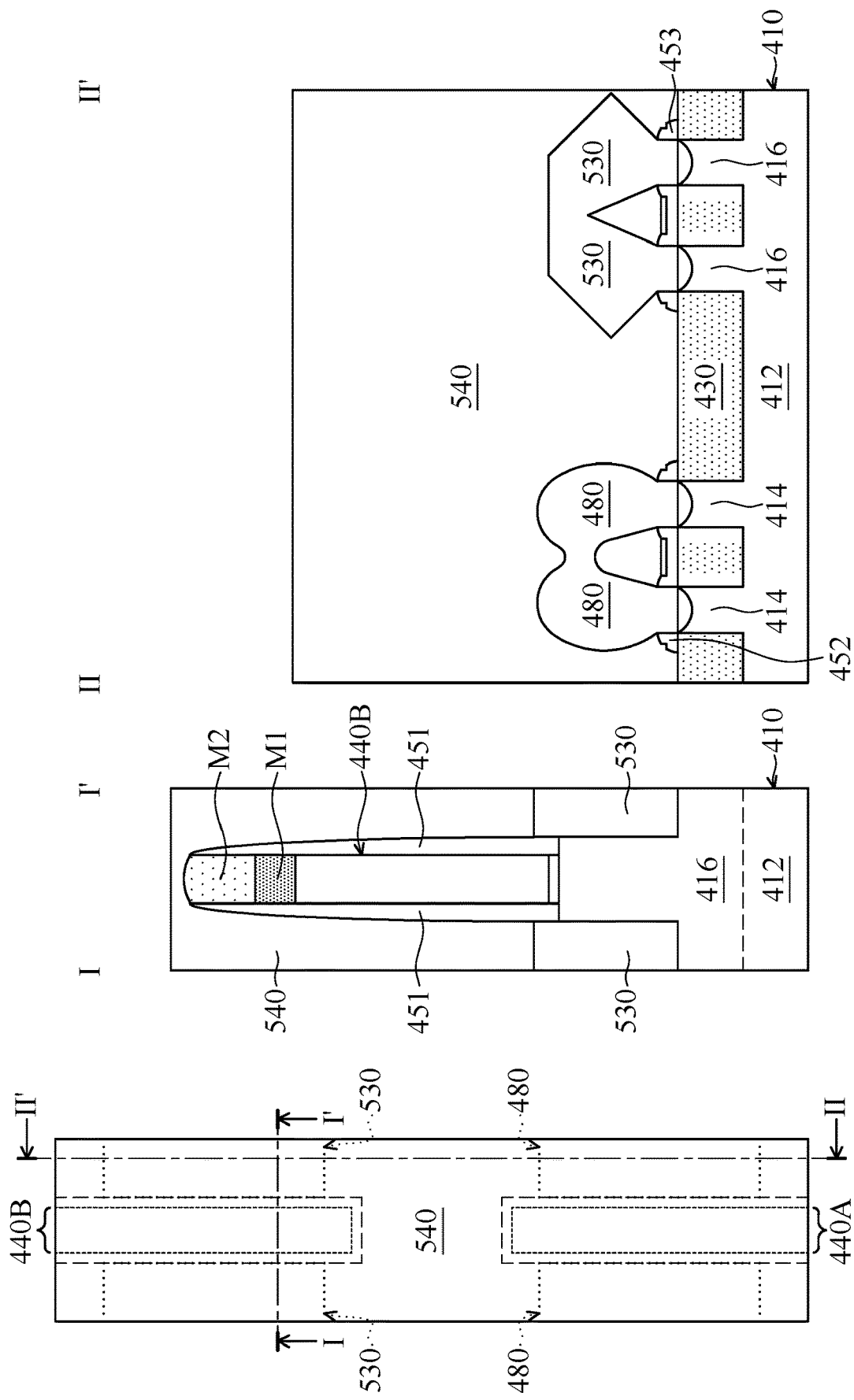

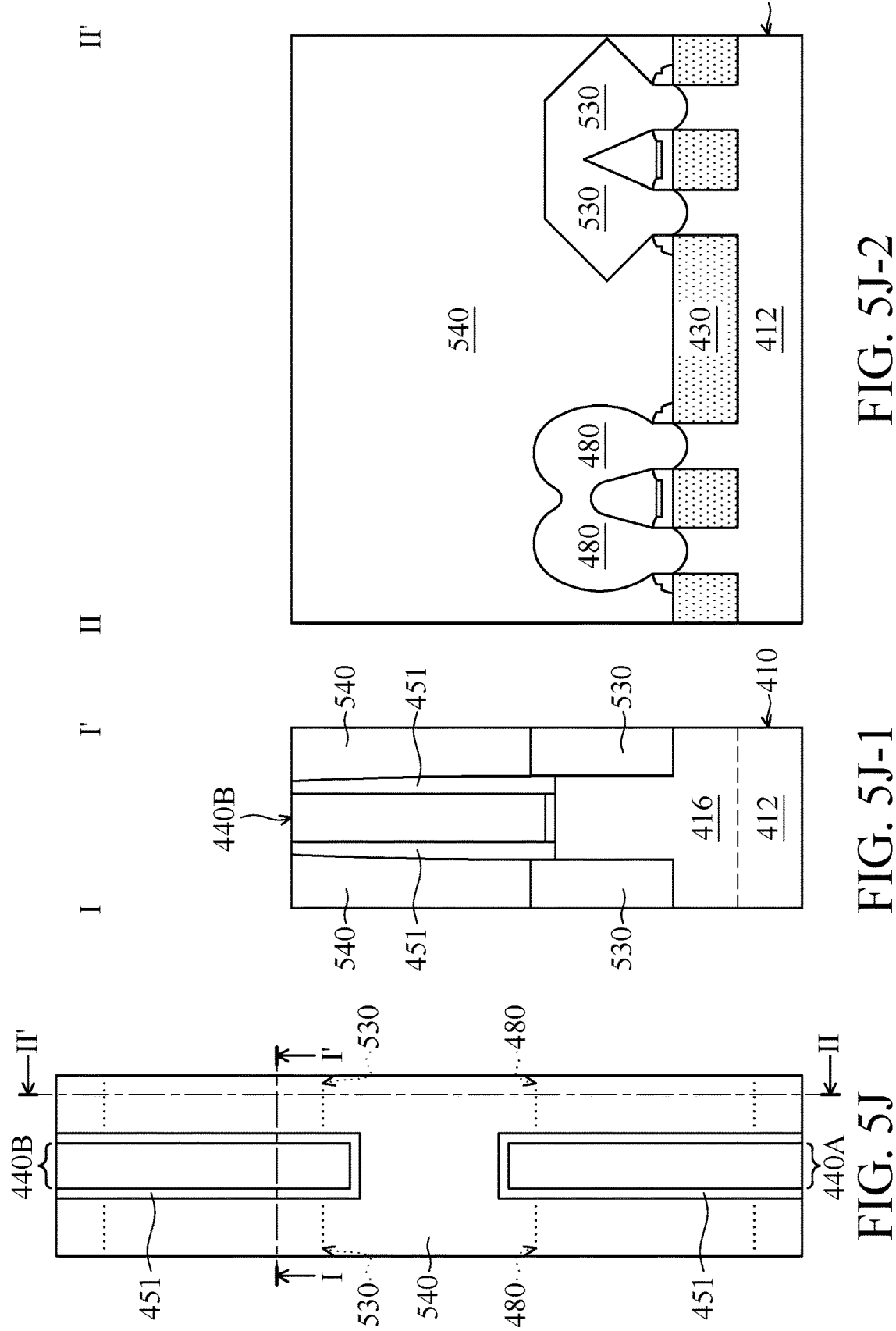

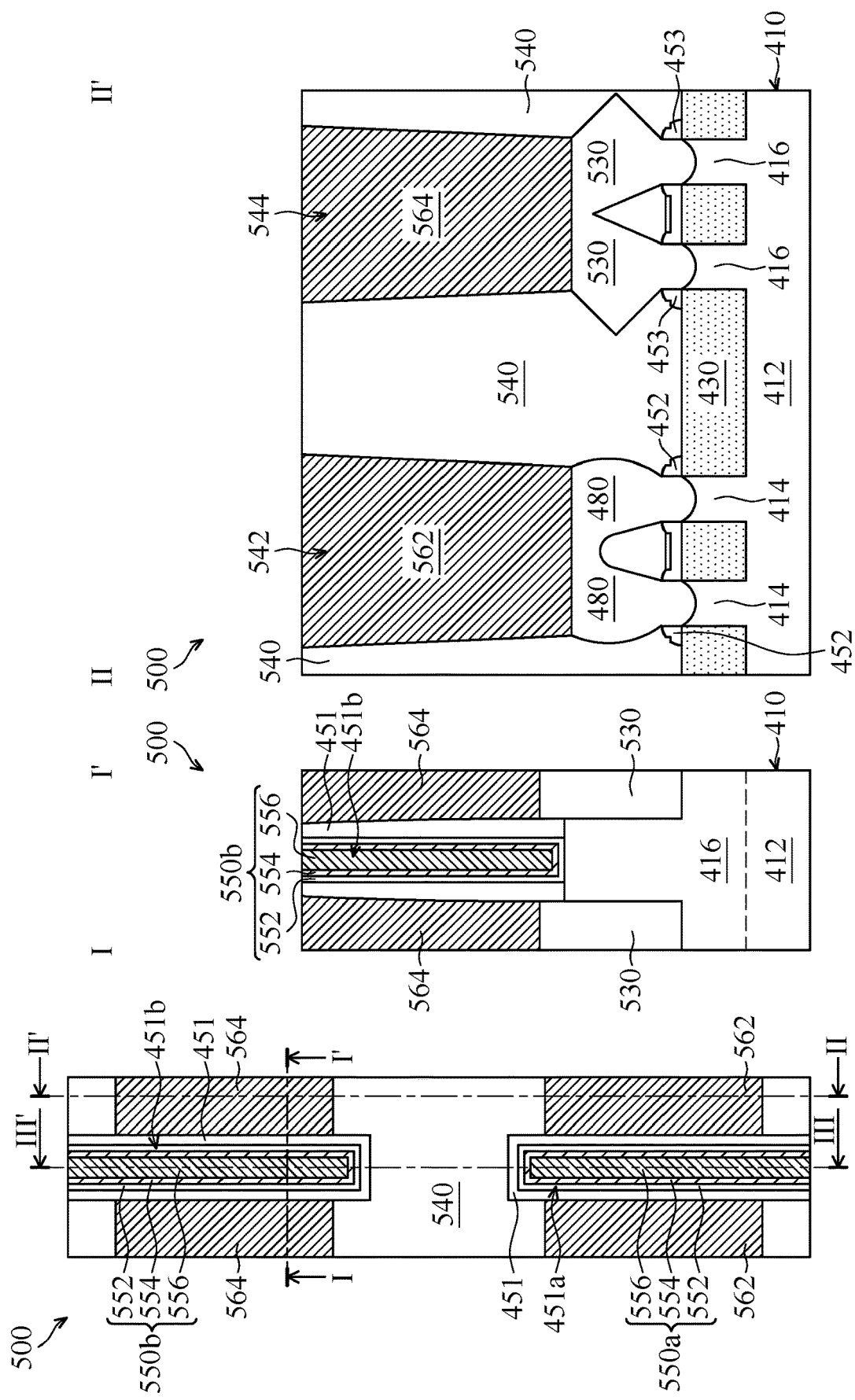

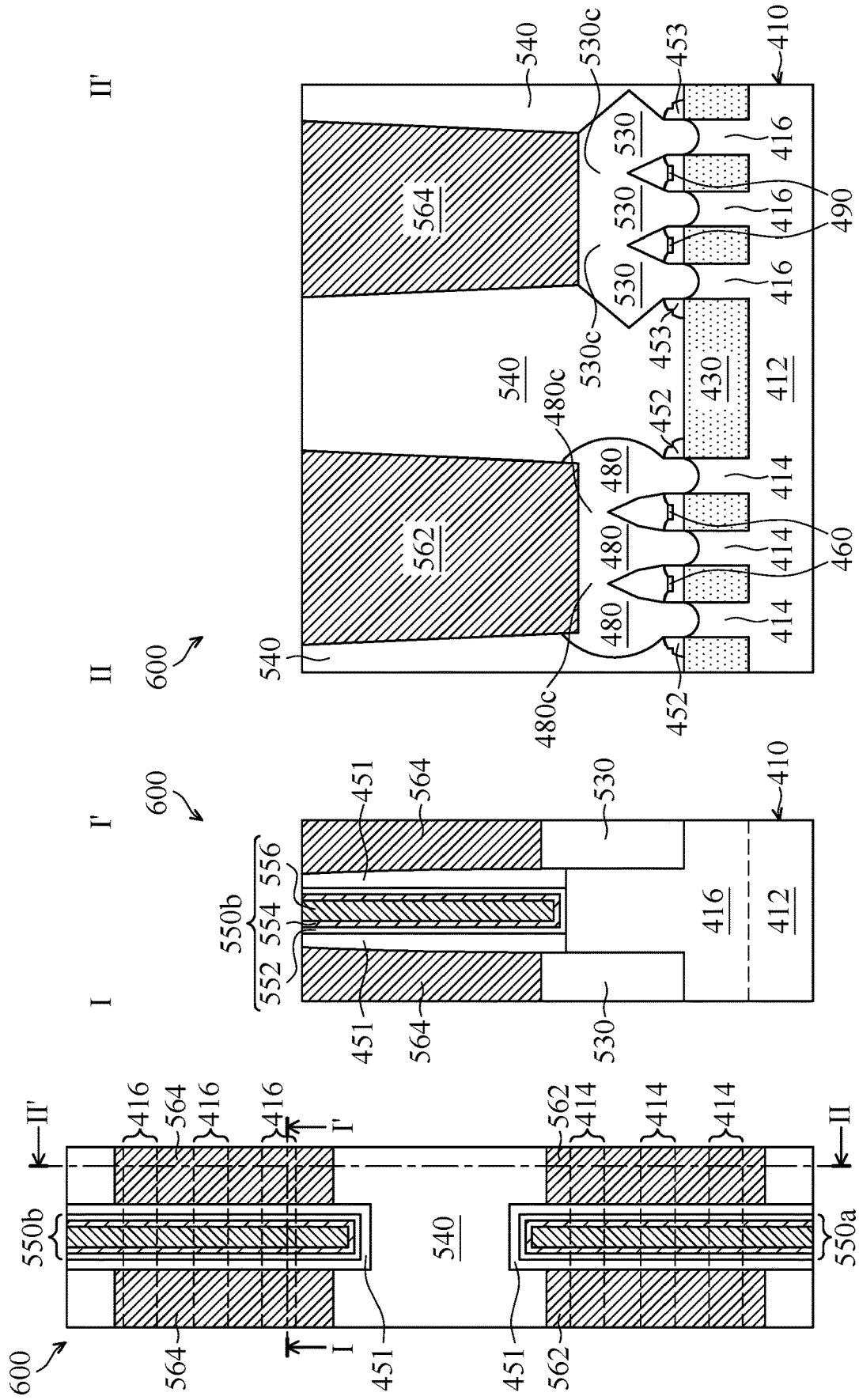

SEMICONDUCTOR DEVICE STRUCTURE WITH SOURCE/DRAIN STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2A-2K are top views of various stages of a process for forming a semiconductor device structure, in accordance with some embodiments.

FIGS. 2A-1 to 2K-1 are cross-sectional views illustrating the semiconductor device structure along a sectional line I-I' in FIGS. 2A-2K, in accordance with some embodiments.

FIGS. 2A-2 to 2K-2 are cross-sectional views illustrating the semiconductor device structure along a sectional line II-II' in FIGS. 2A-2K, in accordance with some embodiments.

FIG. 2K-3 is a cross-sectional view illustrating the semiconductor device structure along a sectional line III-III' in FIG. 2K, in accordance with some embodiments.

FIGS. 5A-5K are top views of various stages of a process for forming a semiconductor device structure, in accordance with some embodiments.

FIGS. 5A-1 to 5K-1 are cross-sectional views illustrating the semiconductor device structure along a sectional line I-I' in FIGS. 5A-5K, in accordance with some embodiments.

FIGS. 5A-2 to 5K-2 are cross-sectional views illustrating the semiconductor device structure along a sectional line II-II' in FIGS. 5A-5K, in accordance with some embodiments.

FIG. 5K-3 is a cross-sectional view illustrating the semiconductor device structure along a sectional line III-III' in FIG. 5K, in accordance with some embodiments.

FIG. 6A is a top view of a semiconductor device structure, in accordance with some embodiments.

FIG. 6B is a cross-sectional view illustrating the semiconductor device structure along a sectional line I-I' in FIG. 6A, in accordance with some embodiments.

FIG. 6C is a cross-sectional view illustrating the semiconductor device structure along a sectional line II-II' in FIG. 6A, in accordance with some embodiments.

DETAILED DESCRIPTION

Figure 1:
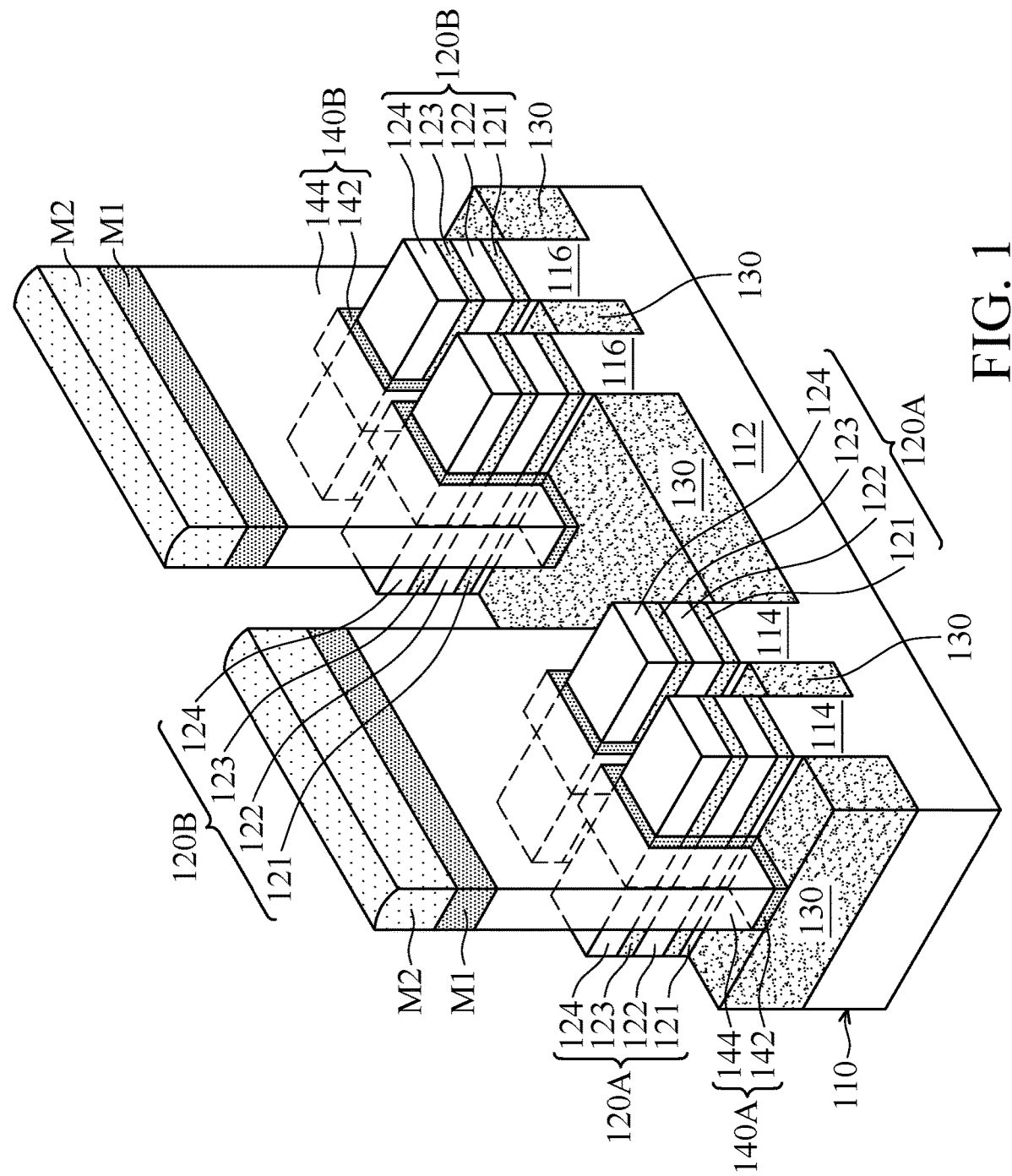
FIG. 1 is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a perspective view of a semiconductor device structure, in accordance with some embodiments. FIGS. 2A-2K are top views of various stages of a process for forming a semiconductor device structure, in accordance with some embodiments.

Figures 1, 2, 2G:
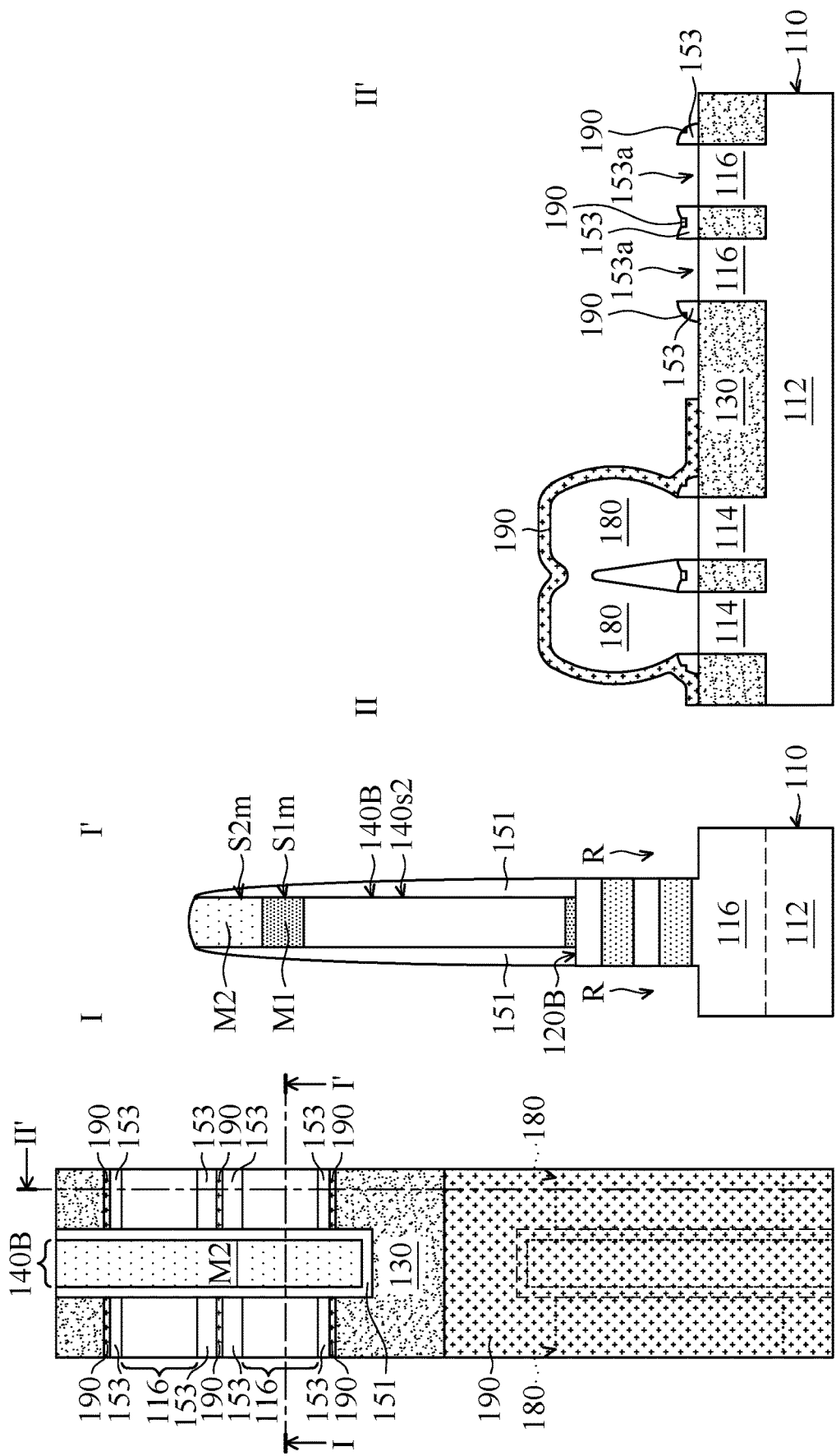
Figures 2, 2K, 3:
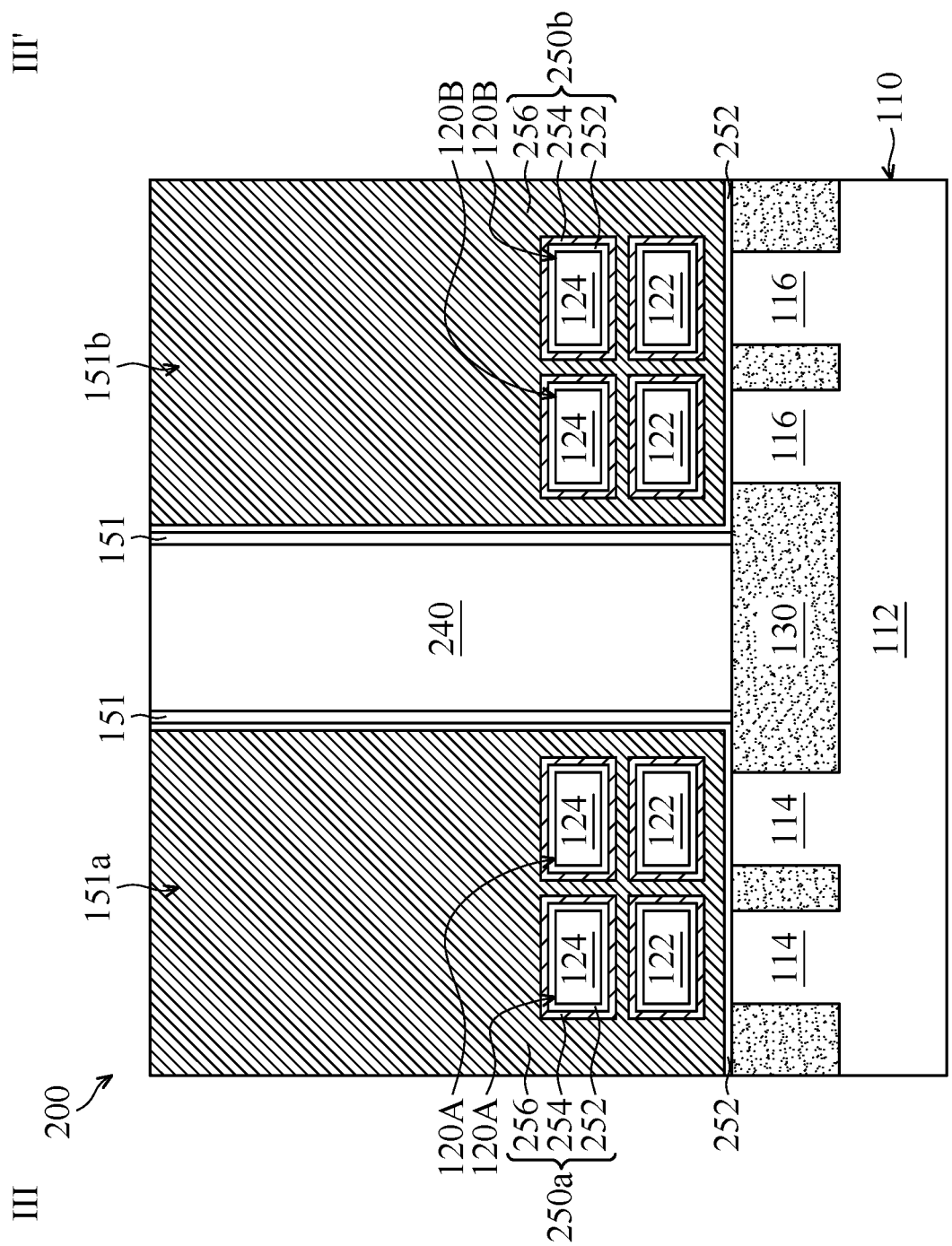

FIGS. 2A-1 to 2K-1 are cross-sectional views illustrating the semiconductor device structure along a sectional line I-I' in FIGS. 2A-2K, in accordance with some embodiments. FIGS. 2A-2 to 2K-2 are cross-sectional views illustrating the semiconductor device structure along a sectional line II-II' in FIGS. 2A-2K, in accordance with some embodiments.

As shown in FIGS. 1, 2A, 2A-1 and 2A-2, a substrate 110 is provided, in accordance with some embodiments. The substrate 110 has a base 112 and fins 114 and 116 over the base 112, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1, 2A, 2A-1 and 2A-2, nanostructure stacks 120A and 120B are formed over the fins 114 and 116 respectively, in accordance with some embodiments. Each nanostructure stack 120A or 120B includes nanostructures 121, 122, 123, and 124, in accordance with some embodiments.

The nanostructures 121, 122, 123, and 124 are sequentially stacked over the fins 114 and 116, in accordance with some embodiments. The nanostructures 121, 122, 123, and 124 include nanowires or nanosheets, in accordance with some embodiments.

The nanostructures 121 and 123 are made of a same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122 and 124 are made of a same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIGS. 1 and 2A, an isolation layer 130 is formed over the base 112, in accordance with some embodiments. The fins 114 and 116 are partially embedded in the isolation layer 130, in accordance with some embodiments. The fins 114 and 116 are surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process or a spin-on process, a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1, 2A, and 2A-1, a gate stack 140A is formed over the nanostructure stacks 120A, the fins 114, and the isolation layer 130, in accordance with some embodiments. The gate stack 140A is wrapped around the nanostructure stacks 120A and top portions of the fins 114, in accordance with some embodiments.

As shown in FIGS. 1, 2A, and 2A-1, a gate stack 140B is formed over the nanostructure stacks 120B, the fins 116, and the isolation layer 130, in accordance with some embodiments. The gate stack 140B is wrapped around the nanostructure stacks 120B and top portions of the fins 116, in accordance with some embodiments.

Each gate stack 140A or 140B includes a gate dielectric layer 142 and a gate electrode 144, in accordance with some embodiments. The gate electrode 144 is over the gate dielectric layer 142, in accordance with some embodiments. The gate dielectric layer 142 is positioned between the gate electrode 144 and the nanostructure stack 120A or 120B, in accordance with some embodiments.

The gate dielectric layer 142 is also positioned between the gate electrode 144 and the fin 114 or 116, in accordance with some embodiments. The gate dielectric layer 142 is positioned between the gate electrode 144 and the isolation layer 130, in accordance with some embodiments.

The gate dielectric layer 142 is made of an oxide-containing material such as silicon oxide, in accordance with some embodiments. The gate dielectric layer 142 is formed using a chemical vapor deposition process and an etching process, in accordance with some embodiments. The gate electrode 144 is made of a semiconductor material such as polysilicon, in accordance with some embodiments. The gate electrode 144 is formed using a chemical vapor deposition process and an etching process, in accordance with some embodiments.

As shown in FIGS. 1, 2A, and 2A-1, a mask layer M1 is formed over the gate stacks 140A and 140B, in accordance with some embodiments. The mask layer M1 is made of a material different from the materials of the gate stacks 140A and 140B, in accordance with some embodiments. The mask layer M1 is made of nitrides (e.g., silicon nitride) or oxynitride (e.g., silicon oxynitride), in accordance with some embodiments.

As shown in FIGS. 1, 2A, and 2A-1, a mask layer M2 is formed over the mask layer M1, in accordance with some embodiments. The mask layer M2 is made of a material different from the materials of the mask layer M1, in accordance with some embodiments. The mask layer M2 is made of oxides (e.g., silicon oxides), in accordance with some embodiments.

As shown in FIGS. 2B, 2B-1 and 2B-2, a spacer layer 150 is conformally deposited over the mask layers M1 and M2, the gate stacks 140A and 140B, the nanostructure stacks 120A and 120B, the fins 114 and 116, and the isolation layer 130, in accordance with some embodiments.

The spacer layer 150 is made of an insulating material, such as a nitride-containing material (e.g., silicon nitride), an oxynitride-containing material (e.g., silicon oxynitride), an oxide-containing material (e.g., silicon oxide), or a carbide-containing material (e.g., SiCON or SiOC), in accordance with some embodiments. The deposition processes include chemical vapor deposition (CVD), physical vapor deposition (PVD), atomic layer deposition (ALD), or another applicable method.

As shown in FIGS. 2B, 2B-1 and 2B-2, a mask layer 160 is conformally deposited over the spacer layer 150, in accordance with some embodiments. The mask layer 160 and the spacer layer 150 are made of different materials, in accordance with some embodiments. The mask layer 160 is made of an insulating material, such as a nitride-containing material (e.g., silicon nitride) or a high-k material (e.g., $HfO_2$, $ZrO_2$, $HfZrO_2$, or $Al_2O_3$), in accordance with some embodiments.

The term "high-k material" refers to a material having a higher dielectric constant than silicon dioxide, in accordance with some embodiments. The deposition processes include chemical vapor deposition (CVD), physical vapor deposition (PVD), atomic layer deposition (ALD), or another applicable method.

As shown in FIGS. 2B and 2B-2, a mask layer 170 is formed over the mask layer 160 over the nanostructure stacks 120B, in accordance with some embodiments. The mask layer 170 is made of a polymer material, such as a photoresist material, in accordance with some embodiments.

As shown in FIGS. 2B, 2C, 2C-1 and 2C-2, portions of the spacer layer 150 and the mask layer 160, which are exposed by the mask layer 170, are removed, in accordance with some embodiments. The spacer layer 150 remaining over sidewalls 140s1, S1m and S2m of the gate stack 140A and the mask layers M1 and M2 forms a spacer 151, in accordance with some embodiments. The sidewalls 140s1 are also referred to as gate sidewalls, in accordance with some embodiments. The spacer layer 150 remaining adjacent to the fins 114 forms a spacer 152, in accordance with some embodiments.

The removal process includes an etching process, in accordance with some embodiments. The etching process includes an anisotropic etching process such as a dry etching process, in accordance with some embodiments.

As shown in FIGS. 2C, 2C-1 and 2C-2, portions of the nanostructure stacks 120A, which are not covered by the gate stack 140A and the spacer 151, are removed, in accordance with some embodiments. The removal process forms trenches R in the nanostructure stacks 120A and the fins 114, in accordance with some embodiments. After the removal process, trenches 152a are formed in the spacer 152, in accordance with some embodiments. The trenches 152a expose the fins 114, in accordance with some embodiments.

The removal process includes an etching process, in accordance with some embodiments. The etching process includes an anisotropic etching process such as a dry etching process, in accordance with some embodiments. As shown in FIGS. 2C, 2C-1 and 2C-2, the mask layer 170 is removed, in accordance with some embodiments.

As shown in FIGS. 2C, 2D, 2D-1 and 2D-2, end portions of the nanostructures 121 and 123 are removed through the trenches R, in accordance with some embodiments. The removal process forms recesses 120r in the nanostructure stacks 120A, in accordance with some embodiments. The recesses 120r are adjacent to the nanostructures 121 and 123, in accordance with some embodiments. The removal process includes an etching process such as a dry etching process or a wet etching process, in accordance with some embodiments.

As shown in FIGS. 2D, 2D-1 and 2D-2, inner spacers 170 are formed in the recesses 120r in the nanostructure stacks 120A, in accordance with some embodiments. The inner spacers 170 are in direct contact with the nanostructures 121, 122, 123, and 124, in accordance with some embodiments.

The inner spacers 170 are made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "low-k material" refers to a material having a lower dielectric constant than silicon dioxide, in accordance with some embodiments. The inner spacers 170 are formed using a deposition process and an etching process, in accordance with some embodiments. The deposition process includes a physical vapor deposition process, a chemical vapor deposition process, an atomic layer deposition process, or the like, in accordance with some embodiments.

As shown in FIGS. 2D, 2D-1 and 2D-2, an epitaxial process is performed to form source/drain intermediate structures 180a over the fins 114, in accordance with some embodiments. In some embodiments, upper edges E1 of the source/drain intermediate structures 180a are merged to form a merged portion 180a1 of the source/drain intermediate structures 180a. The source/drain intermediate structure 180a has an inverted-trapezoid shape, in accordance with some embodiments.

As shown in FIGS. 2E, 2E-1 and 2E-2, the epitaxial process continues to be performed, and source/drain structures 180 (i.e. the final source/drain structures) are formed in the trenches 152a of the spacer 152 and over the fins 114, in accordance with some embodiments. In some embodiments, upper edges E2 of the source/drain structures 180 are merged to form a merged portion 180c of the source/drain structures 180.

In some embodiments, the source/drain structures 180 are made of a semiconductor material (e.g., silicon) with N-type dopants, such as the Group VA element, in accordance with some embodiments. The Group VA element includes phosphor (P), antimony (Sb), or another suitable Group VA material.

The precursor gas used in the epitaxial process includes $SiH_4$, $Si_2H_6$, $SiH_2Cl_2$, $SiHCl_3$, and/or $SiH_3Cl$, in accordance with some embodiments. The carrier gas used in the epitaxial process includes hydrogen ($H_2$), in accordance with some embodiments. The carrier gas has a partial pressure ranging from about 1 Torr to about 760 Torr, in accordance with some embodiments. The process temperature of the epitaxial process ranges from about 620° C. to about 740° C., in accordance with some embodiments.

As shown in FIGS. 2D-2 and 2E-2, since the partial pressure of the carrier gas and the process temperature are both high, the epitaxial growth rate on the (100) plane is greater than that on other planes, in accordance with some embodiments. Therefore, the merged portion 180a1 or 180c is in a high position with respect to a top surface 152b of the spacer 152, in accordance with some embodiments.

In some embodiments, a ratio of a height H1 of the merged portion 180c to a height H2 of a top surface 181 of the source/drain structure 180 is greater than or equal to about 0.5. The ratio (H1/H2) ranges from about 0.50 to about 0.95, in accordance with some embodiments. The heights H1 and H2 are defined with respect to the top surface 152b of the spacer 152, in accordance with some embodiments.

There is a gap G1, which is under the merged portion 180c and between the source/drain structures 180, in accordance with some embodiments. In some embodiments, a length L1 of the gap G1 is greater than a width W1 of the gap G1. The height H1 of the merged portion 180c is greater than the width W1, in accordance with some embodiments. The ratio of the height H1 to the width W1 ranges from about 1.1 to about 3, in accordance with some embodiments.

Since the merged portion 180c is in the high position, the volume of the gap G1 is increased, which reduces the volume of the source/drain structures 180, in accordance with some embodiments. Therefore, the parasitic capacitance between the source/drain structures 180 is reduced, in accordance with some embodiments. As a result, the performance of a semiconductor device structure with the source/drain structures 180 is improved, in accordance with some embodiments.

The source/drain structure 180 (the left one) has opposite sidewalls S1 and S2, in accordance with some embodiments. The sidewall S1 faces the adjacent source/drain structure 180, in accordance with some embodiments. The sidewall S2 faces away from the adjacent source/drain structure 180, in accordance with some embodiments. The sidewall S1 is asymmetrical to the sidewall S2 with respect to the fin 114 thereunder, in accordance with some embodiments. The sidewall S2 is a curved sidewall, in accordance with some embodiments.

The sidewall S1 is steeper than the sidewall S2 with respect to the top surface 112a of the base 112, in accordance with some embodiments. In some embodiments, an absolute value of a slope of the sidewall S1 is different from an absolute value of a slope of the sidewall S2. The absolute value of the slope of the sidewall S1 is greater than the absolute value of the slope of the sidewall S2, in accordance with some embodiments.

The height H1 of the merged portion 180c is greater than a thickness T180c of the merged portion 180c, in accordance with some embodiments. The sidewall S1 is under the merged portion 180c, in accordance with some embodiments.

The source/drain structure 180 (the right one) has a sidewall S3 facing the adjacent source/drain structure 180 (the left one), in accordance with some embodiments. The sidewall S3 is steeper than the sidewall S2 with respect to the top surface 112a of the base 112, in accordance with some embodiments.

The source/drain structure 180 (the right one) has a sidewall S4 opposite to the sidewall S3, in accordance with some embodiments. The sidewall S3 is steeper than the sidewall S4 with respect to the top surface 112a of the base 112, in accordance with some embodiments. The sidewall S4 is a curved surface, in accordance with some embodiments.

The source/drain structures 180 are connected to the nanostructures 122 and 124, in accordance with some embodiments. The source/drain structures 180 are in direct contact with the nanostructures 122 and 124, the inner spacers 170, and the substrate 110, in accordance with some embodiments.

As shown in FIGS. 2F, 2F-1 and 2F-2, the mask layer 160 is removed, in accordance with some embodiments. A portion of the mask layer 160 between the source/drain structures 180 remains under the merged portion 180c after the removal process, in accordance with some embodiments.

As shown in FIGS. 2F, 2F-1 and 2F-2, a mask layer 190 is conformally formed over the spacer layer 150, the isolation layer 130, the spacer 152, and the source/drain structures 180, in accordance with some embodiments. The mask layer 190 and the spacer layer 150 are made of different materials, in accordance with some embodiments.

The mask layer 190 is made of an insulating material, such as a nitride-containing material (e.g., silicon nitride) or a high-k material (e.g., $HfO_2$, $ZrO_2$, $HfZrO_2$, or $Al_2O_3$), in accordance with some embodiments. The deposition processes include chemical vapor deposition (CVD), physical vapor deposition (PVD), atomic layer deposition (ALD), or another applicable method.

As shown in FIGS. 2F, 2F-1 and 2F-2, a mask layer 210 is formed over the mask layer 190 over the source/drain structures 180, in accordance with some embodiments. The mask layer 210 is made of a polymer material, such as a photoresist material, in accordance with some embodiments.

As shown in FIGS. 2G, 2G-1 and 2G-2, portions of the spacer layer 150 and the mask layer 190, which are exposed by the mask layer 210, are removed, in accordance with some embodiments. The spacer layer 150 remaining over sidewalls 140s2, S1m and S2m of the gate stack 140B and the mask layers M1 and M2 forms a spacer 151, in accordance with some embodiments. The sidewalls 140s2 are also referred to as gate sidewalls, in accordance with some embodiments. The spacer layer 150 remaining adjacent to the fins 116 forms a spacer 153, in accordance with some embodiments.

The removal process includes an etching process, in accordance with some embodiments. The etching process includes an anisotropic etching process such as a dry etching process, in accordance with some embodiments.

As shown in FIGS. 2G, 2G-1 and 2G-2, portions of the nanostructure stacks 120B, which are not covered by the gate stack 140B and the spacer 151, are removed, in accordance with some embodiments. The removal process forms trenches R in the nanostructure stacks 120B and the fins 116, in accordance with some embodiments. After the removal process, trenches 153a are formed in the spacer 153, in accordance with some embodiments. The trenches 153a expose the fins 116, in accordance with some embodiments.

The removal process includes an etching process, in accordance with some embodiments. The etching process includes an anisotropic etching process such as a dry etching process, in accordance with some embodiments. As shown in FIGS. 2G, 2G-1 and 2G-2, the mask layer 210 is removed, in accordance with some embodiments.

As shown in FIGS. 2G, 2H, 2H-1 and 2H-2, end portions of the nanostructures 121 and 123 are removed through the trenches R, in accordance with some embodiments. The removal process forms recesses 120r in the nanostructure stacks 120B, in accordance with some embodiments. The recesses 120r are adjacent to the nanostructures 121 and 123, in accordance with some embodiments. The removal process includes an etching process such as a dry etching process or a wet etching process, in accordance with some embodiments.

As shown in FIGS. 2H, 2H-1 and 2H-2, inner spacers 220 are formed in the recesses 120r in the nanostructure stacks 120B, in accordance with some embodiments. The inner spacers 220 are in direct contact with the nanostructures 121, 122, 123, and 124, in accordance with some embodiments.

The inner spacers 220 are made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "low-k material" refers to a material having a lower dielectric constant than silicon dioxide, in accordance with some embodiments. The inner spacers 220 are formed using a deposition process and an etching process, in accordance with some embodiments. The deposition process includes a physical vapor deposition process, a chemical vapor deposition process, an atomic layer deposition process, or the like, in accordance with some embodiments.

As shown in FIGS. 2H, 2H-1 and 2H-2, an epitaxial process is performed to form source/drain structures 230 in the trenches 153a of the spacer 153, in accordance with some embodiments. In some embodiments, upper edges of the source/drain structures 230 are merged to form a merged portion 230c of the source/drain structures 230.

There is a gap G11, which is under the merged portion 230c and between the source/drain structures 230, in accordance with some embodiments. In some embodiments, a length L11 of the gap G11 is greater than a width W11 of the gap G11.

Similar to the merged portion 180c, the merged portion 230c is located in a high position, in accordance with some embodiments. Since the merged portion 230c is in the high position, the volume of the gap G11 is increased, which reduces the volume of the source/drain structures 230, in accordance with some embodiments. Therefore, the parasitic capacitance between the source/drain structures 230 is reduced, in accordance with some embodiments. As a result, the performance of a semiconductor device structure with the source/drain structures 230 is improved, in accordance with some embodiments.

The source/drain structure 230 (the left one) has opposite sidewalls S5 and S6, in accordance with some embodiments.

The sidewall S5 faces the adjacent source/drain structure 230, in accordance with some embodiments. The sidewall S6 faces away from the adjacent source/drain structure 230, in accordance with some embodiments. The sidewall S5 is asymmetrical to the sidewall S6 with respect to the fin 116 thereunder, in accordance with some embodiments.

The sidewall S5 is under the merged portion 230c, in accordance with some embodiments. The sidewall S5 is steeper than the sidewall S6 with respect to the top surface 112a of the base 112, in accordance with some embodiments.

In some embodiments, an absolute value of a slope of the sidewall S5 is different from an absolute value of a slope of the sidewall S6. The absolute value of the slope of the sidewall S5 is greater than the absolute value of the slope of the sidewall S6, in accordance with some embodiments.

The height H11 of the merged portion 230c is greater than or equal to the height H12 of convex corners 232 of the source/drain structures 230, in accordance with some embodiments. The heights H11 and H12 are defined with respect to the top surface 153b of the spacer 153, in accordance with some embodiments.

The source/drain structure 230 (the right one) has a sidewall S7 facing the adjacent source/drain structure 230 (the left one), in accordance with some embodiments. The sidewall S7 is steeper than the sidewall S6 with respect to the top surface 112a of the base 112, in accordance with some embodiments.

The source/drain structure 230 (the right one) has a sidewall S8 opposite to the sidewall S7, in accordance with some embodiments. The sidewall S7 is steeper than the sidewall S8 with respect to the top surface 112a of the base 112, in accordance with some embodiments.

The source/drain structures 230 are connected to the nanostructures 122 and 124, in accordance with some embodiments. The source/drain structures 230 are in direct contact with the nanostructures 122 and 124, the inner spacers 220, and the substrate 110, in accordance with some embodiments.

In some embodiments, the source/drain structures 230 are made of a semiconductor material (e.g., silicon germanium) with P-type dopants, such as the Group IIIA element, in accordance with some embodiments. The Group IIIA element includes boron or another suitable material.

The source/drain structures 230 are formed using an epitaxial process, in accordance with some embodiments. The precursor gas used in the epitaxial process includes $GeH_4$, in accordance with some embodiments. The carrier gas used in the epitaxial process includes hydrogen ($H_2$), in accordance with some embodiments. The carrier gas has a partial pressure ranging from about 1 Torr to about 760 Torr, in accordance with some embodiments. The process temperature of the epitaxial process ranges from about 620° C. to about 740° C., in accordance with some embodiments.

As shown in FIGS. 2I, 2I-1 and 2I-2, a dielectric layer 240 is formed over the source/drain structures 180 and 230, in accordance with some embodiments. The dielectric layer 240 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 240 is formed by a deposition process (e.g., a chemical vapor deposition process), in accordance with some embodiments.

As shown in FIGS. 2J, 2J-1 and 2J-2, a top portion of the dielectric layer 240 and the mask layers M1 and M2 are removed, in accordance with some embodiments. As shown in FIGS. 2K, 2K-1 and 2K-2, the gate stacks 140A and 140B are removed, in accordance with some embodiments. The removal process forms trenches 151a and 151b in the spacer structure 151, in accordance with some embodiments.

As shown in FIGS. 2J-1, 2K, and 2K-1, the nanostructures 121 and 123 are removed through the trenches 151a and 151b of the spacer structure 151, in accordance with some embodiments. The removal process for removing the gate stacks 140A and 140B and the nanostructures 121 and 123 includes an etching process such as a wet etching process or a dry etching process, in accordance with some embodiments.

FIG. 2K-3 is a cross-sectional view illustrating the semiconductor device structure along a sectional line III-III' in FIG. 2K, in accordance with some embodiments. As shown in FIGS. 2K, 2K-1 and 2K-3, gate stacks 250a and 250b are formed in the trenches 151a and 151b of the spacer structure 151, in accordance with some embodiments. Each gate stack 250a or 250b surrounds the nanostructures 122 and 124, in accordance with some embodiments.

Each gate stack 250a or 250b includes a gate dielectric layer 252, a work function metal layer 254, and a gate electrode layer 256, in accordance with some embodiments. The gate dielectric layer 252 conformally covers the nanostructures 122 and 124 and the trenches 151a and 151b, in accordance with some embodiments. The gate dielectric layer 252 is made of a high-K material, such as $HfO_2$, $ZrO_2$, $HfZrO_2$, or $Al_2O_3$. The gate dielectric layer 252 is formed using chemical vapor deposition (CVD), physical vapor deposition (PVD), atomic layer deposition (ALD), or another applicable method.

The work function metal layer 254 is conformally formed over the gate dielectric layer 252, in accordance with some embodiments. The work function metal layer 254 is made of TiN, TaN, TiSiN, or another suitable conductive material. The work function metal layer 254 is formed using chemical vapor deposition (CVD), physical vapor deposition (PVD), atomic layer deposition (ALD), or another applicable method.

The gate electrode layer 256 is formed over the work function metal layer 254, in accordance with some embodiments. The gate electrode layer 256 is made of W, Co, Al, or another suitable conductive material. The gate electrode layer 256 is formed using chemical vapor deposition (CVD), physical vapor deposition (PVD), atomic layer deposition (ALD), or another applicable method.

As shown in FIGS. 2K, 2K-1 and 2K-2, portions of the dielectric layer 240 are removed to form through holes 242 and 244 in the dielectric layer 240, in accordance with some embodiments. As shown in FIGS. 2K, 2K-1 and 2K-2, contact structures 262 and 264 are formed in the through holes 242 and 244 respectively, in accordance with some embodiments. In this step, a semiconductor device structure 200 is substantially formed, in accordance with some embodiments.

The contact structures 262 and 264 are in direct contact with the source/drain structures 180 and 230 respectively, in accordance with some embodiments. The contact structures 262 and 264 are made of W, Cu, Co, Al, or another suitable conductive material.

Although the volume of the source/drain structures 180 and 230 is reduced, the contact area between the contact structures 262 and 264 and the source/drain structures 180 and 230 remains unchanged, in accordance with some embodiments. Therefore, the contact resistance between the contact structures 262 and 264 and the source/drain structures 180 and 230 remains unchanged, in accordance with some embodiments.

Although the volume of the source/drain structures 180 and 230 is reduced, the contact area between the nanostructures 122 and 124 and the source/drain structures 180 and 230 remains unchanged, in accordance with some embodiments. Therefore, the contact resistance between the nanostructures 122 and 124 and the source/drain structures 180 and 230 remains unchanged, in accordance with some embodiments.

Since the volume of the source/drain structures 180 and 230 is reduced, the parasitic capacitance between the source/drain structures 180 and 230 and the gate stacks 250*a* and 250*b* is reduced, in accordance with some embodiments. As a result, the performance of the semiconductor device structure 200 is improved, in accordance with some embodiments.

Figures 3A, 3B, 3C:
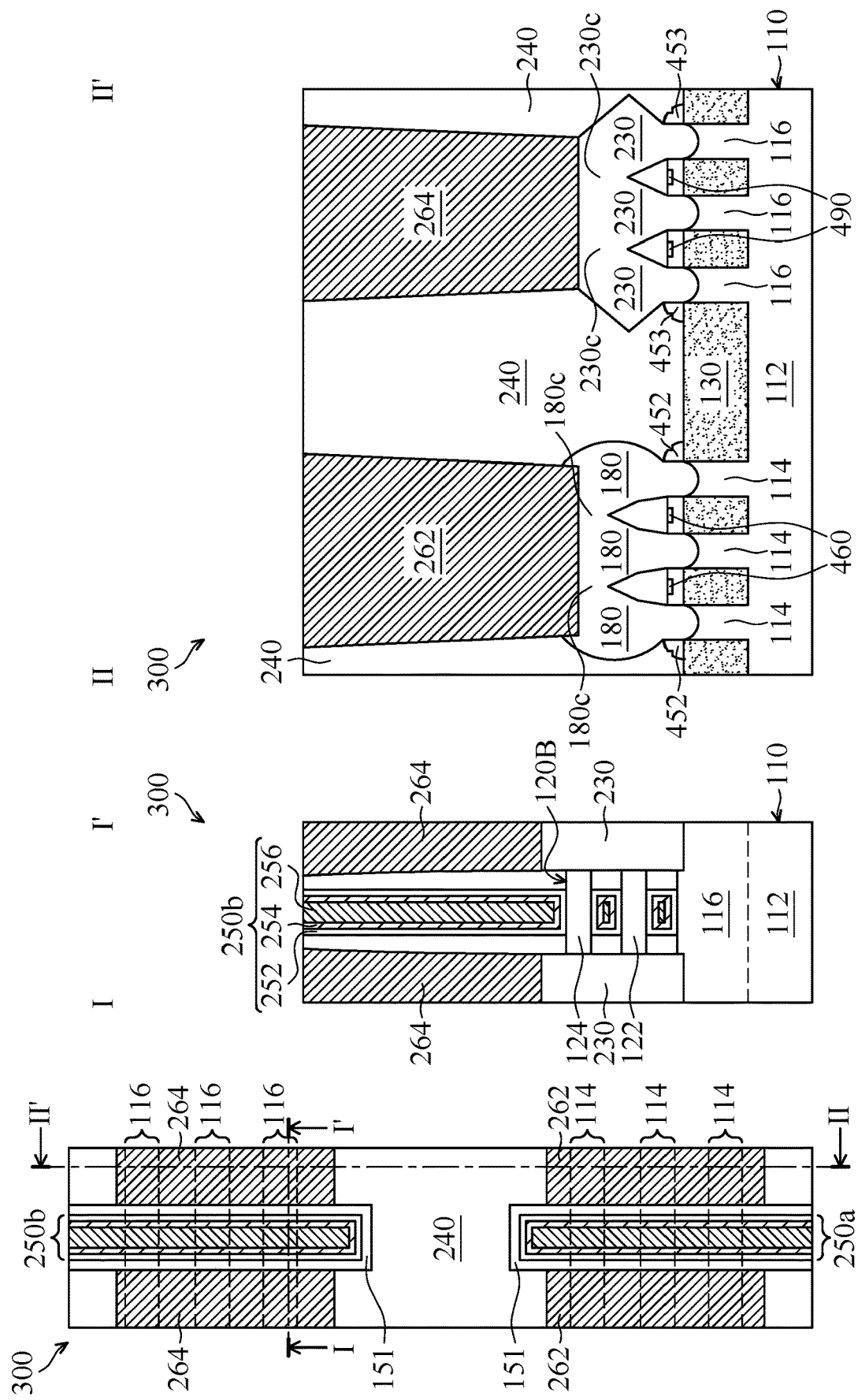
FIG. 3A is a top view of a semiconductor device structure, in accordance with some embodiments.
FIG. 3B is a cross-sectional view illustrating the semiconductor device structure along a sectional line I-I' in FIG. 3A, in accordance with some embodiments.
FIG. 3C is a cross-sectional view illustrating the semiconductor device structure along a sectional line II-II' in FIG. 3A, in accordance with some embodiments.

FIG. 3A is a top view of a semiconductor device structure, in accordance with some embodiments. FIG. 3B is a cross-sectional view illustrating the semiconductor device structure along a sectional line I-I' in FIG. 3A, in accordance with some embodiments. FIG. 3C is a cross-sectional view illustrating the semiconductor device structure along a sectional line II-II' in FIG. 3A, in accordance with some embodiments.

As shown in FIGS. 3A, 3B, and 3C, the semiconductor device structure 300 is similar to the semiconductor device structure 200 of FIG. 2K, except that the semiconductor device structure 300 has three fins 114, three fins 116, three source/drain structures 180, and three source/drain structures 230, in accordance with some embodiments.

The upper edges of the source/drain structures 180 are merged to form merged portions 180*c* of the source/drain structures 180, in accordance with some embodiments. The source/drain structure 180 (the middle one) is substantially symmetric laterally with respect to the fin 114 thereunder, in accordance with some embodiments.

The upper edges of the source/drain structures 230 are merged to form merged portions 230*c* of the source/drain structures 230, in accordance with some embodiments. The source/drain structure 230 (the middle one) is substantially symmetric laterally with respect to the fin 116 thereunder, in accordance with some embodiments.

Figure 4:
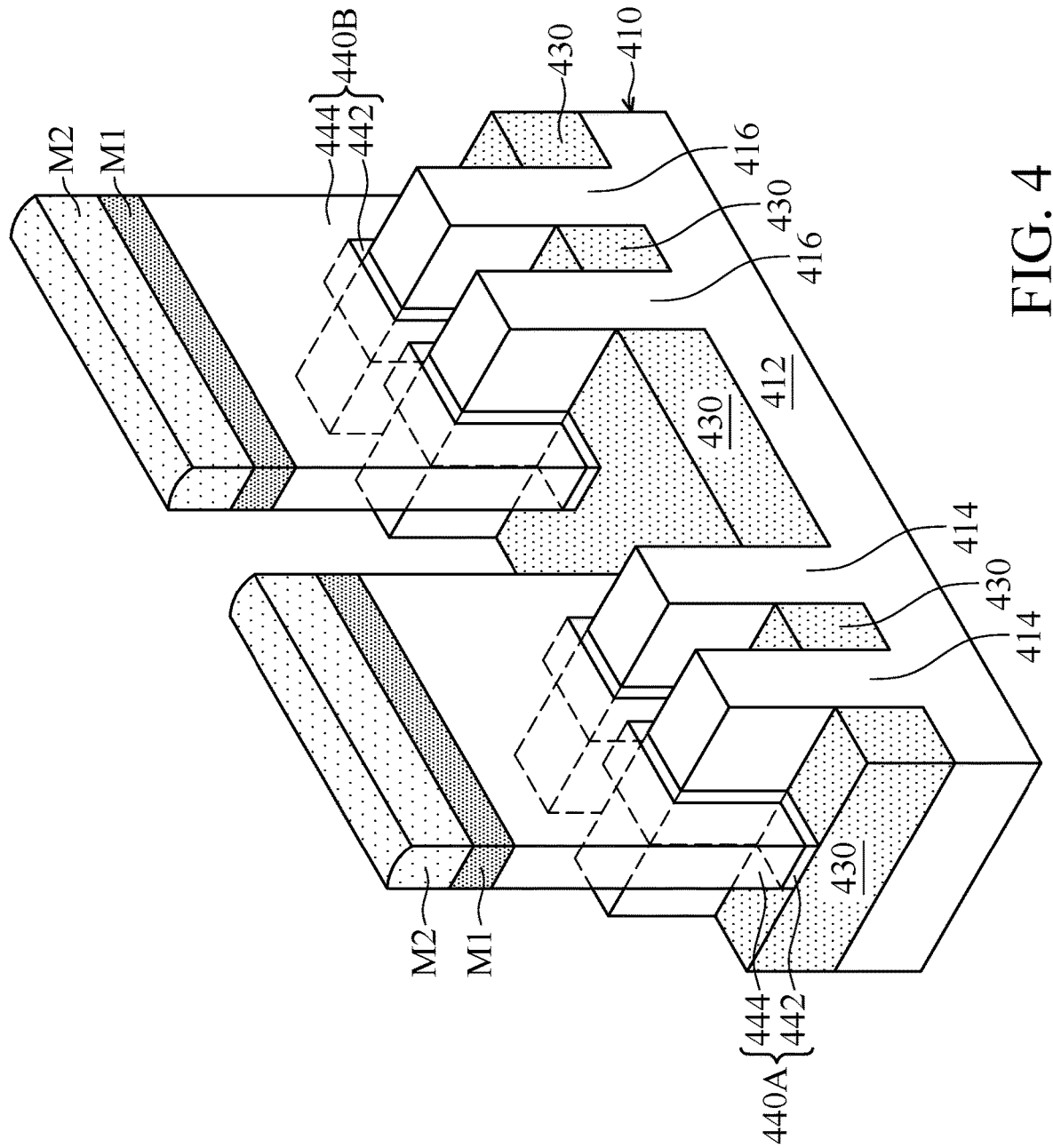
FIG. 4 is a perspective view of a semiconductor device structure, in accordance with some embodiments.

FIG. 4 is a perspective view of a semiconductor device structure, in accordance with some embodiments. FIGS. 5A-5K are top views of various stages of a process for forming a semiconductor device structure, in accordance with some embodiments.

Figures 1, 2, 5A:
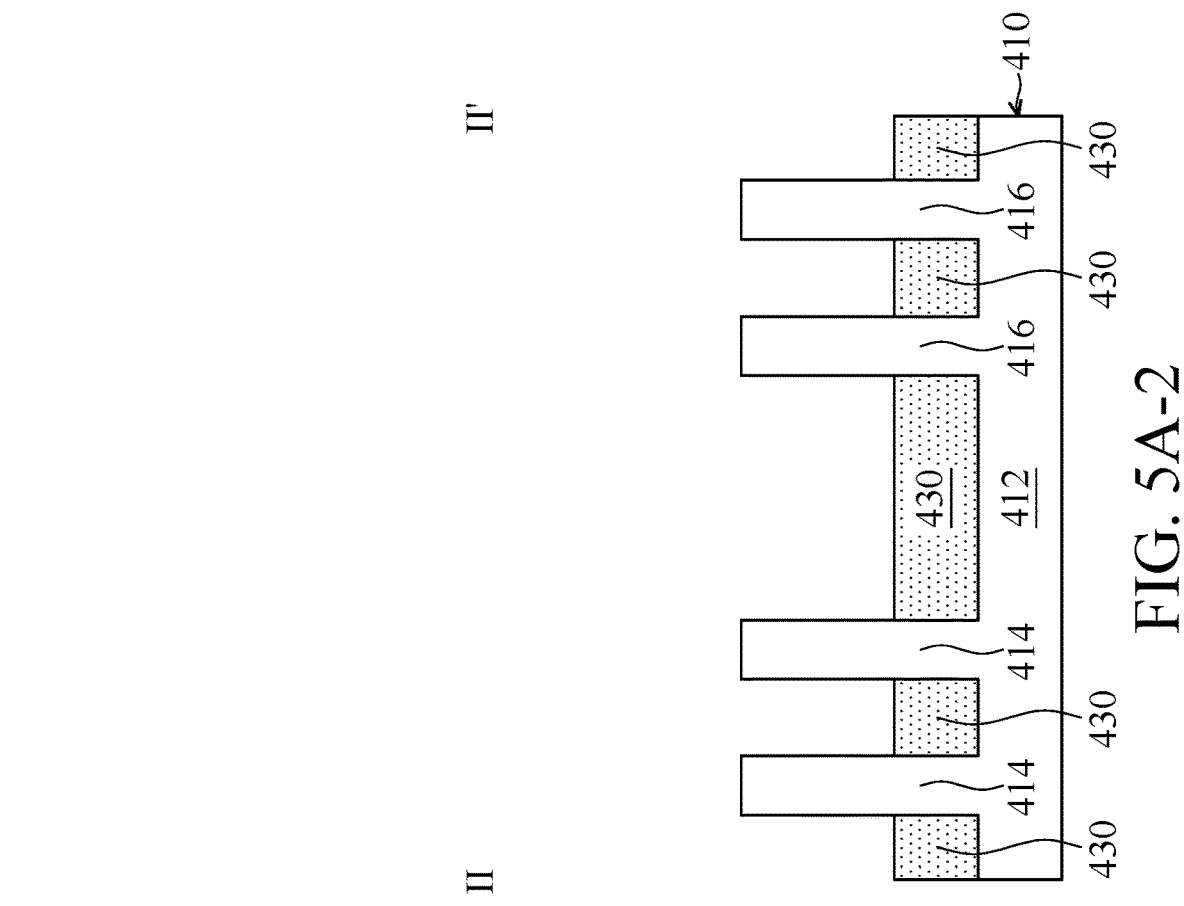
Figure 5A:
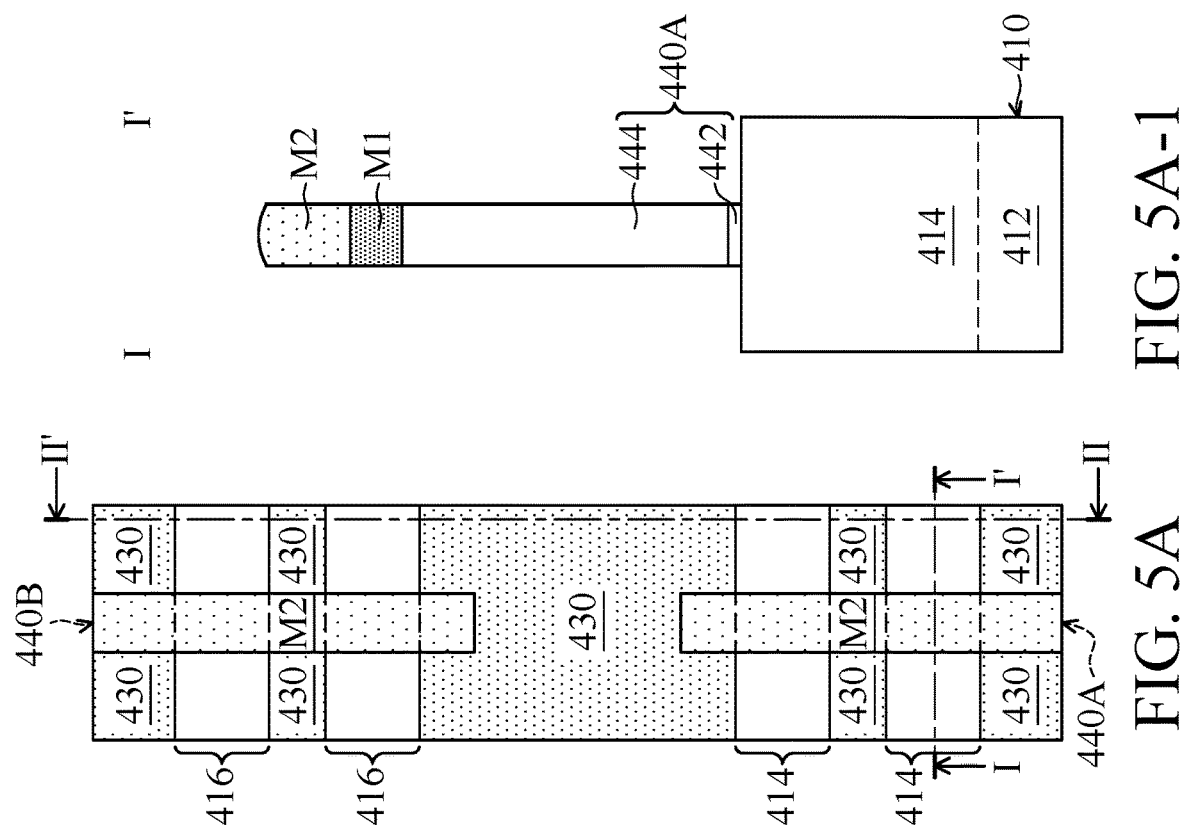
Figures 1, 2, 5E:
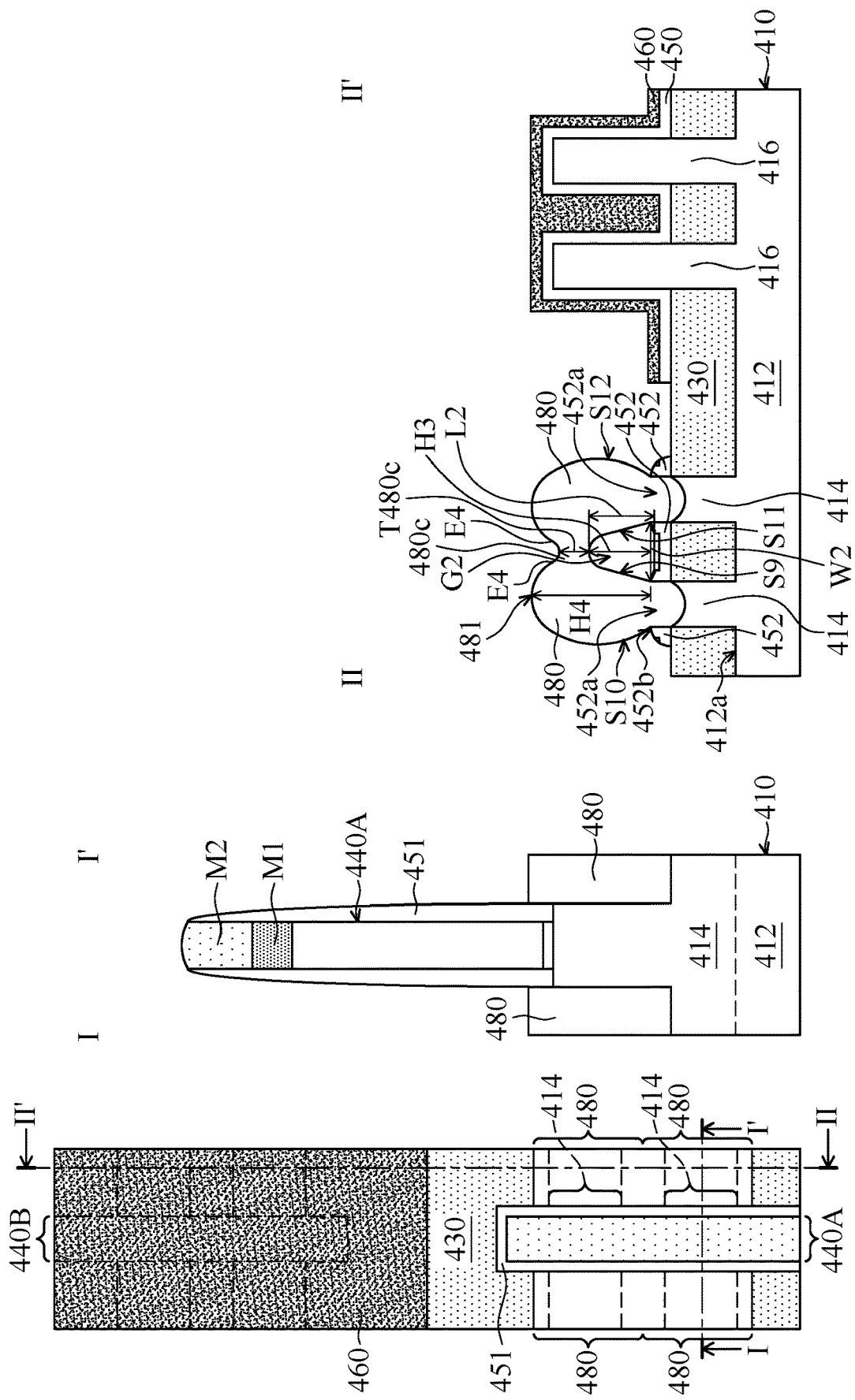
Figures 3, 5K:
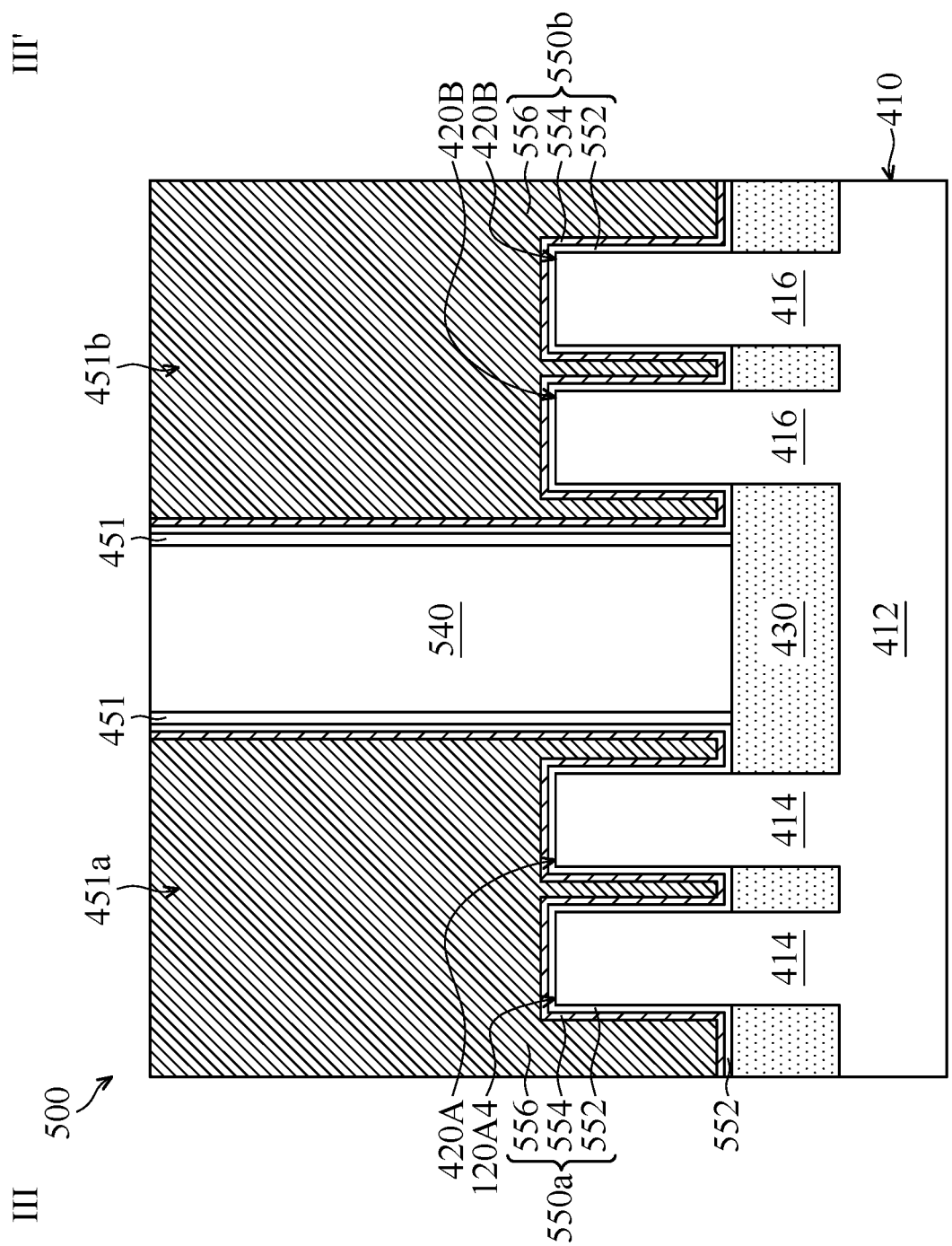

FIGS. 5A-1 to 5K-1 are cross-sectional views illustrating the semiconductor device structure along a sectional line I-I' in FIGS. 5A-5K, in accordance with some embodiments. FIGS. 5A-2 to 5K-2 are cross-sectional views illustrating the semiconductor device structure along a sectional line II-II' in FIGS. 5A-5K, in accordance with some embodiments.

As shown in FIGS. 4, 5A, 5A-1 and 5A-2, a substrate 410 is provided, in accordance with some embodiments. The substrate 410 has a base 412 and fins 414 and 416 over the base 412, in accordance with some embodiments. The substrate 410 includes, for example, a semiconductor substrate. The substrate 410 includes, for example, a semiconductor wafer (such as a silicon wafer) or a portion of a semiconductor wafer.

In some embodiments, the substrate 410 is made of an elementary semiconductor material including silicon or germanium in a single crystal structure, a polycrystal structure, or an amorphous structure. In some other embodiments, the substrate 410 is made of a compound semiconductor, such as silicon carbide, gallium arsenide, gallium phosphide, indium phosphide, indium arsenide, an alloy semiconductor, such as SiGe, or GaAsP, or a combination thereof. The substrate 410 may also include multi-layer semiconductors, semiconductor on insulator (SOI) (such as silicon on insulator or germanium on insulator), or a combination thereof.

In some embodiments, the substrate 410 is a device wafer that includes various device elements. In some embodiments, the various device elements are formed in and/or over the substrate 410. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 410. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 410. The isolation features are used to define active regions and electrically isolate various device elements formed in and/or over the substrate 410 in the active regions. In some embodiments, the isolation features include shallow trench isolation (STI) features, local oxidation of silicon (LOCOS) features, other suitable isolation features, or a combination thereof.

As shown in FIGS. 4 and 5A, an isolation layer 430 is formed over the base 412, in accordance with some embodiments. The fins 414 and 416 are partially embedded in the isolation layer 430, in accordance with some embodiments. The fins 414 and 416 are surrounded by the isolation layer 430, in accordance with some embodiments.

The isolation layer 430 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 430 is formed using a deposition process or a spin-on process, a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 4, 5A, and 5A-1, a gate stack 440A is formed over the fins 414 and the isolation layer 430, in accordance with some embodiments. The gate stack 440A is wrapped around top portions of the fins 414, in accordance with some embodiments.

As shown in FIGS. 4, 5A, and 5A-1, a gate stack 440B is formed over the fins 416 and the isolation layer 430, in accordance with some embodiments. The gate stack 440B is wrapped around top portions of the fins 416, in accordance with some embodiments.

Each gate stack 440A or 440B includes a gate dielectric layer 442 and a gate electrode 444, in accordance with some embodiments. The gate electrode 444 is over the gate dielectric layer 442, in accordance with some embodiments. The gate dielectric layer 442 is positioned between the gate electrode 444 and the fin 414 or 416, in accordance with some embodiments. The gate dielectric layer 442 is positioned between the gate electrode 444 and the isolation layer 430, in accordance with some embodiments.

The gate dielectric layer 442 is made of an oxide-containing material such as silicon oxide, in accordance with some embodiments. The gate dielectric layer 442 is formed using a chemical vapor deposition process and an etching process, in accordance with some embodiments. The gate electrode 444 is made of a semiconductor material such as polysilicon, in accordance with some embodiments. The gate electrode 444 is formed using a chemical vapor deposition process and an etching process, in accordance with some embodiments.

As shown in FIGS. 4, 5A, and 5A-1, a mask layer M1 is formed over the gate stacks 440A and 440B, in accordance with some embodiments. The mask layer M1 is made of a material different from the materials of the gate stacks 440A and 440B, in accordance with some embodiments. The mask layer M1 is made of nitrides (e.g., silicon nitride) or oxynitride (e.g., silicon oxynitride), in accordance with some embodiments.

As shown in FIGS. 4, 5A, and 5A-1, a mask layer M2 is formed over the mask layer M1, in accordance with some embodiments. The mask layer M2 is made of a material different from the material of the mask layer M1, in accordance with some embodiments. The mask layer M2 is made of oxides (e.g., silicon oxides), in accordance with some embodiments.

As shown in FIGS. 5B, 5B-1 and 5B-2, a spacer layer 450 is conformally deposited over the mask layers M1 and M2, the gate stacks 440A and 440B, the fins 414 and 416, and the isolation layer 430, in accordance with some embodiments.

The spacer layer 450 is made of an insulating material, such as a nitride-containing material (e.g., silicon nitride), an oxynitride-containing material (e.g., silicon oxynitride), an oxide-containing material (e.g., silicon oxide), or a carbide-containing material (e.g., SiCON or SiOC), in accordance with some embodiments. The deposition process includes chemical vapor deposition (CVD), physical vapor deposition (PVD), atomic layer deposition (ALD), or another applicable method.

As shown in FIGS. 5B, 5B-1 and 5B-2, a mask layer 460 is conformally deposited over the spacer layer 450, in accordance with some embodiments. The mask layer 460 and the spacer layer 450 are made of different materials, in accordance with some embodiments. The mask layer 460 is made of an insulating material, such as a nitride-containing material (e.g., silicon nitride) or a high-k material (e.g., $HfO_2$, $ZrO_2$, $HfZrO_2$, or $Al_2O_3$), in accordance with some embodiments. The deposition processes include chemical vapor deposition (CVD), physical vapor deposition (PVD), atomic layer deposition (ALD), or another applicable method.

As shown in FIGS. 5B and 5B-2, a mask layer 470 is formed over the mask layer 460 over the fins 416, in accordance with some embodiments. The mask layer 470 is made of a polymer material, such as a photoresist material, in accordance with some embodiments.

As shown in FIGS. 5B, 5C, 5C-1 and 5C-2, portions of the spacer layer 450 and the mask layer 460, which are exposed by the mask layer 470, are removed, in accordance with some embodiments. The spacer layer 450 remaining over sidewalls 440s1, S1m and S2m of the gate stack 440A and the mask layers M1 and M2 forms a spacer 451, in accordance with some embodiments. The spacer layer 450 remaining adjacent to the fins 414 forms a spacer 452, in accordance with some embodiments. The sidewalls 440s1 are also referred to as gate sidewalls, in accordance with some embodiments.

The removal process includes an etching process, in accordance with some embodiments. The etching process includes an anisotropic etching process such as a dry etching process, in accordance with some embodiments.

As shown in FIGS. 5C, 5C-1 and 5C-2, portions of the fins 414, which are not covered by the gate stack 440A and the spacer 451, are removed, in accordance with some embodiments. The removal process forms trenches R in the fins 414, in accordance with some embodiments. After the removal process, trenches 452a are formed in the spacer 452, in accordance with some embodiments. The trenches 452a expose the fins 414, in accordance with some embodiments.

The removal process includes an etching process, in accordance with some embodiments. The etching process includes an anisotropic etching process such as a dry etching process, in accordance with some embodiments. As shown in FIGS. 5C, 5C-1 and 5C-2, the mask layer 470 is removed, in accordance with some embodiments.

As shown in FIGS. 5D, 5D-1 and 5D-2, an epitaxial process is performed to form source/drain intermediate structures 480a over the fins 414, in accordance with some embodiments. In some embodiments, upper edges E3 of the source/drain intermediate structures 480a are merged to form a merged portion 480a1 of the source/drain intermediate structures 480a.

As shown in FIGS. 5E, 5E-1 and 5E-2, the epitaxial process continues to be performed, and source/drain structures 480 (i.e. the final source/drain structures) are formed in the trenches 452a of the spacer 452, in accordance with some embodiments. In some embodiments, upper edges E4 of the source/drain structures 480 are merged to form a merged portion 480c of the source/drain structures 480.

In some embodiments, a ratio of a height H3 of the merged portion 480c to a height H4 of a top surface 481 of the source/drain structure 480 is greater than or equal to about 0.5. The heights H3 and H4 are defined with respect to a top surface 452b of the spacer 452, in accordance with some embodiments. The height H3 of the merged portion 480c is greater than a thickness T480c of the merged portion 480c, in accordance with some embodiments.

There is a gap G2, which is under the merged portion 480c and between the source/drain structures 480, in accordance with some embodiments. In some embodiments, a length L2 of the gap G2 is greater than a width W2 of the gap G2.

The source/drain structure 480 (the left one) has opposite sidewalls S9 and S10, in accordance with some embodiments. The sidewall S9 faces the adjacent source/drain structure 480, in accordance with some embodiments. The sidewall S9 is under the merged portion 480c, in accordance with some embodiments.

The sidewall S10 faces away from the adjacent source/drain structure 480, in accordance with some embodiments. The sidewall S9 is asymmetrical to the sidewall S10 with respect to the fin 414 thereunder, in accordance with some embodiments. The sidewall S10 is a curved sidewall, in accordance with some embodiments.

The sidewall S9 is steeper than the sidewall S10 with respect to the top surface 412a of the base 412, in accordance with some embodiments. In some embodiments, an absolute value of a slope of the sidewall S9 is different from an absolute value of a slope of the sidewall S10. The absolute value of the slope of the sidewall S9 is greater than the absolute value of the slope of the sidewall S10, in accordance with some embodiments.

The source/drain structure 480 (the right one) has a sidewall S11 facing the adjacent source/drain structure 480 (the left one), in accordance with some embodiments. The sidewall S11 is steeper than the sidewall S10 with respect to the top surface 412a of the base 412, in accordance with some embodiments.

The source/drain structure 480 (the right one) has a sidewall S12 opposite to the sidewall S11, in accordance with some embodiments. The sidewall S11 is steeper than the sidewall S12 with respect to the top surface 412a of the base 412, in accordance with some embodiments. The sidewall S12 is a curved surface, in accordance with some embodiments.

The source/drain structures 480 are connected to the fins 414, in accordance with some embodiments. The source/drain structures 480 are in direct contact with the fins 414, in accordance with some embodiments.

In some embodiments, the source/drain structures 480 are made of a semiconductor material (e.g., silicon) with N-type dopants, such as the Group VA element, in accordance with some embodiments. The Group VA element includes phosphor (P), antimony (Sb), or another suitable Group VA material.

The source/drain structures 480 are formed using an epitaxial process, in accordance with some embodiments. The precursor gas used in the epitaxial process includes $SiH_4$, $Si_2H_6$, $SiH_2Cl_2$, $SiHCl_3$, and/or $SiH_3Cl$, in accordance with some embodiments. The carrier gas used in the epitaxial process includes hydrogen ($H_2$), in accordance with some embodiments. The carrier gas has a partial pressure ranging from about 1 Torr to about 760 Torr, in accordance with some embodiments. The process temperature of the epitaxial process ranges from about 620° C. to about 740° C., in accordance with some embodiments.

As shown in FIGS. 5F, 5F-1 and 5F-2, the mask layer 460 is removed, in accordance with some embodiments. A portion of the mask layer 460 between the source/drain structures 480 remains under the merged portion 480c after the removal process, in accordance with some embodiments.

As shown in FIGS. 5F, 5F-1 and 5F-2, a mask layer 490 is deposited over the spacer layer 450, the isolation layer 430, the spacers 452, and the source/drain structures 480, in accordance with some embodiments. The mask layer 490 and the spacer layer 450 are made of different materials, in accordance with some embodiments.

The mask layer 490 is made of an insulating material, such as a nitride-containing material (e.g., silicon nitride) or a high-k material (e.g., $HfO_2$, $ZrO_2$, $HfZrO_2$, or $Al_2O_3$), in accordance with some embodiments. The deposition processes include chemical vapor deposition (CVD), physical vapor deposition (PVD), atomic layer deposition (ALD), or another applicable method.

As shown in FIGS. 5F, 5F-1 and 5F-2, a mask layer 510 is formed over the mask layer 490 over the source/drain structures 480, in accordance with some embodiments. The mask layer 510 is made of a polymer material, such as a photoresist material, in accordance with some embodiments.

As shown in FIGS. 5G, 5G-1 and 5G-2, portions of the spacer layer 450 and the mask layer 490, which are exposed by the mask layer 510, are removed, in accordance with some embodiments. The spacer layer 450 remaining over sidewalls 440s2, S1m and S2m of the gate stack 440B and the mask layers M1 and M2 forms a spacer 451, in accordance with some embodiments. The sidewalls 440s2 are also referred to as gate sidewalls, in accordance with some embodiments. The spacer layer 450 remaining adjacent to the fins 416 forms a spacer 453, in accordance with some embodiments.

The removal process includes an etching process, in accordance with some embodiments. The etching process includes an anisotropic etching process such as a dry etching process, in accordance with some embodiments.

As shown in FIGS. 5G, 5G-1 and 5G-2, portions of the fins 416, which are not covered by the gate stack 440B and the spacer 451, are removed, in accordance with some embodiments. The removal process forms trenches R in the fins 416, in accordance with some embodiments. After the removal process, trenches 453a are formed in the spacer 453, in accordance with some embodiments. The trenches 453a expose the fins 416, in accordance with some embodiments.

The removal process includes an etching process, in accordance with some embodiments. The etching process includes an anisotropic etching process such as a dry etching process, in accordance with some embodiments. As shown in FIGS. 5G, 5G-1 and 5G-2, the mask layer 510 is removed, in accordance with some embodiments.

As shown in FIGS. 5H, 5H-1 and 5H-2, an epitaxial process is performed to form source/drain structures 530 in the trenches 453a of the spacer 453, in accordance with some embodiments. In some embodiments, upper edges of the source/drain structures 530 are merged to form a merged portion 530c of the source/drain structures 530.

There is a gap G22, which is under the merged portion 530c and between the source/drain structures 530, in accordance with some embodiments. In some embodiments, a length L22 of the gap G22 is greater than a width W22 of the gap G22.

Similar to the merged portion 480c, the merged portion 530c is located in a high position, in accordance with some embodiments. Since the merged portion 530c is in the high position, the volume of the gap G22 is increased, which reduces the volume of the source/drain structures 530, in accordance with some embodiments. Therefore, the parasitic capacitance between the source/drain structures 530 is reduced, in accordance with some embodiments. As a result, the performance of a semiconductor device structure with the source/drain structures 530 is improved, in accordance with some embodiments.

The source/drain structure 530 (the left one) has opposite sidewalls S13 and S14, in accordance with some embodiments. The sidewall S13 faces the adjacent source/drain structure 530, in accordance with some embodiments. The sidewall S14 faces away from the adjacent source/drain structure 530, in accordance with some embodiments. The sidewall S13 is asymmetrical to the sidewall S14 with respect to the fin 416 thereunder, in accordance with some embodiments.

In some embodiments, an absolute value of a slope of the sidewall S13 is different from an absolute value of a slope of the sidewall S14. The absolute value of the slope of the sidewall S13 is greater than the absolute value of the slope of the sidewall S14, in accordance with some embodiments.

The height H22 of the merged portion 530c is greater than or equal to the height H23 of convex corners 532 of the source/drain structures 530, in accordance with some embodiments. The heights H22 and H23 are defined with respect to the top surface 453b of the spacer 453, in accordance with some embodiments.

The source/drain structure 530 (the right one) has a sidewall S15 facing the adjacent source/drain structure 530 (the left one), in accordance with some embodiments. The sidewall S15 is steeper than the sidewall S14 with respect to the top surface 412a of the base 412, in accordance with some embodiments.

The source/drain structure 530 (the right one) has a sidewall S16 opposite to the sidewall S15, in accordance with some embodiments. The sidewall S15 is steeper than the sidewall S16 with respect to the top surface 412a of the base 412, in accordance with some embodiments.

The source/drain structures 530 are connected to the fins 416, in accordance with some embodiments. The source/drain structures 530 are in direct contact with the fins 416, in accordance with some embodiments.

In some embodiments, the source/drain structures 530 are made of a semiconductor material (e.g., silicon germanium) with P-type dopants, such as the Group IIIA element, in accordance with some embodiments. The Group IIIA element includes boron or another suitable material.

The source/drain structures 530 are formed using an epitaxial process, in accordance with some embodiments. The precursor gas used in the epitaxial process includes $GeH_4$, in accordance with some embodiments. The carrier gas used in the epitaxial process includes hydrogen ($H_2$), in accordance with some embodiments. The carrier gas has a partial pressure ranging from about 1 Torr to about 760 Torr, in accordance with some embodiments. The process temperature of the epitaxial process ranges from about 620° C. to about 740° C., in accordance with some embodiments.

As shown in FIGS. 5I, 5I-1 and 5I-2, a dielectric layer 540 is formed over the source/drain structures 480 and 530, in accordance with some embodiments. The dielectric layer 540 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 540 is formed by a deposition process (e.g., a chemical vapor deposition process), in accordance with some embodiments.

As shown in FIGS. 5J, 5J-1 and 5J-2, a top portion of the dielectric layer 540 and the mask layers M1 and M2 are removed, in accordance with some embodiments. As shown in FIGS. 5K, 5K-1 and 5K-2, the gate stacks 440A and 440B are removed, in accordance with some embodiments. The removal process forms trenches 451a and 451b in the spacer structure 451, in accordance with some embodiments.

FIG. 5K-3 is a cross-sectional view illustrating the semiconductor device structure along a sectional line III-III' in FIG. 5K, in accordance with some embodiments. As shown in FIGS. 5K, 5K-1 and 5K-3, gate stacks 550a and 550b are formed in the trenches 451a and 451b of the spacer structure 451, in accordance with some embodiments. Each gate stack 550a or 550b surrounds the fins 414 or 416, in accordance with some embodiments.

Each gate stack 550a or 550b includes a gate dielectric layer 552, a work function metal layer 554, and a gate electrode layer 556, in accordance with some embodiments. The gate dielectric layer 552 conformally covers inner walls and a bottom surface of the trench 451a or 451b, in accordance with some embodiments. The gate dielectric layer 552 is made of a high-K material, such as $HfO_2$, $ZrO_2$, $HfZrO_2$, or $Al_2O_3$. The gate dielectric layer 552 is formed using chemical vapor deposition (CVD), physical vapor deposition (PVD), atomic layer deposition (ALD), or another applicable method.

The work function metal layer 554 is conformally formed over the gate dielectric layer 552, in accordance with some embodiments. The work function metal layer 554 is made of TiN, TaN, TiSiN, or another suitable conductive material. The work function metal layer 554 is formed using chemical vapor deposition (CVD), physical vapor deposition (PVD), atomic layer deposition (ALD), or another applicable method.

The gate electrode layer 556 is formed over the work function metal layer 554, in accordance with some embodiments. The gate electrode layer 556 is made of W, Co, Al, or another suitable conductive material. The gate electrode layer 556 is formed using chemical vapor deposition (CVD), physical vapor deposition (PVD), atomic layer deposition (ALD), or another applicable method.

As shown in FIGS. 5K, 5K-1 and 5K-2, portions of the dielectric layer 540 are removed to form through holes 542 and 544 in the dielectric layer 540, in accordance with some embodiments. As shown in FIGS. 5K, 5K-1 and 5K-2, contact structures 562 and 564 are formed in the through holes 542 and 544 respectively, in accordance with some embodiments. In this step, a semiconductor device structure 500 is substantially formed, in accordance with some embodiments.

The contact structures 562 and 564 are in direct contact with the source/drain structures 480 and 530 respectively, in accordance with some embodiments. The contact structures 562 and 564 are made of W, Cu, Co, Al, or another suitable conductive material.

Although the volume of the source/drain structures 480 and 530 is reduced, the contact area between the contact structures 562 and 564 and the source/drain structures 480 and 530 remains unchanged, in accordance with some embodiments. Therefore, the contact resistance between the contact structures 562 and 564 and the source/drain structures 480 and 530 remains unchanged, in accordance with some embodiments.

Although the volume of the source/drain structures 480 and 530 is reduced, the contact area between the fins 414 and 416 and the source/drain structures 480 and 530 remains unchanged, in accordance with some embodiments. Therefore, the contact resistance between the fins 414 and 416 and the source/drain structures 480 and 530 remains unchanged, in accordance with some embodiments.

Since the volume of the source/drain structures 480 and 530 is reduced, the parasitic capacitance between the source/drain structures 480 and 530 and the gate stacks 550a and 550b is reduced, in accordance with some embodiments. As a result, the performance of the semiconductor device structure 500 is improved, in accordance with some embodiments.

FIG. 6A is a top view of a semiconductor device structure, in accordance with some embodiments. FIG. 6B is a cross-sectional view illustrating the semiconductor device structure along a sectional line I-I' in FIG. 6A, in accordance with some embodiments. FIG. 6C is a cross-sectional view illustrating the semiconductor device structure along a sectional line II-II' in FIG. 6A, in accordance with some embodiments.

As shown in FIGS. 6A, 6B, and 6C, the semiconductor device structure 600 is similar to the semiconductor device structure 500 of FIG. 5K, except that the semiconductor device structure 600 has three fins 414, three fins 416, three source/drain structures 480, and three source/drain structures 530, in accordance with some embodiments.

The upper edges of the source/drain structures 480 are merged to form merged portions 480c of the source/drain structures 480, in accordance with some embodiments. The source/drain structure 480 (the middle one) is substantially symmetric laterally with respect to the fin 414 thereunder, in accordance with some embodiments.

The upper edges of the source/drain structures 530 are merged to form merged portions 530c of the source/drain structures 530, in accordance with some embodiments. The source/drain structure 530 (the middle one) is substantially symmetric laterally with respect to the fin 416 thereunder, in accordance with some embodiments.

Processes and materials for forming the semiconductor device structures 300, 500, and 600 may be similar to, or the same as, those for forming the semiconductor device structure 200 described above. Elements designated by the same or similar reference numbers as those in FIGS. 1 to 6C have the same or similar structures and the materials. Therefore, the detailed descriptions thereof will not be repeated herein.

In accordance with some embodiments, semiconductor device structures and methods for forming the same are provided. The methods (for forming the semiconductor device structures) form two adjacent source/drain structures, which are merged with each other to form a merged portion. The merged portion is in a high position, and therefore the volume of a gap between the source/drain structures is increased, which reduces the volume of the source/drain structures. Therefore, the parasitic capacitance between the source/drain structures or between the source/drain structures and a gate stack is reduced. As a result, the performance of the semiconductor device structures is improved.

In accordance with some embodiments, a method for forming a semiconductor device structure is provided. The method includes providing a substrate having a base, a first fin, and a second fin over the base. The method includes forming a gate stack over the first fin and the second fin. The method includes forming a first spacer over gate sidewalls of the gate stack and a second spacer adjacent to the second fin. The method includes partially removing the first fin and the second fin, which are not covered by the gate stack and the first spacer, to form a first trench in the first fin and a second trench in the second fin. The method includes forming a first source/drain structure and a second source/drain structure in the first trench and the second trench respectively. A first upper edge of the first source/drain structure and a second upper edge of the second source/drain structure are merged to form a first merged portion of the first source/drain structure and the second source/drain structure, a first ratio of a first height of the first merged portion to a second height of a first top surface of the first source/drain structure is greater than or equal to about 0.5, and the first height and the second height are defined with respect to a second top surface of the second spacer.

In accordance with some embodiments, a method for forming a semiconductor device structure is provided. The method includes providing a substrate having a base, a first fin, and a second fin over the base. The method includes forming a first nanostructure stack and a second nanostructure stack over the first fin and the second fin respectively. The first nanostructure stack comprises a first nanostructure and a second nanostructure, and the second nanostructure stack comprises a third nanostructure and a fourth nanostructure. The method includes forming a gate stack over the first nanostructure stack, the second nanostructure, the first fin, and the second fin. The method includes partially removing the first nanostructure stack, the second nanostructure stack, the first fin, and the second fin, which are not covered by the gate stack, to form a first trench in the first nanostructure stack and the first fin and a second trench in the second nanostructure stack and the second fin. The method includes removing end portions of the first nanostructure and the third nanostructure through the first trench and the second trench to form a first recess and a second recess in the first nanostructure stack and the second nanostructure stack respectively. The method includes forming a first source/drain structure and a second source/drain structure in the first trench and the second trench respectively. A first upper edge of the first source/drain structure and a second upper edge of the second source/drain structure are merged to form a merged portion of the first source/drain structure and the second source/drain structure, the first source/drain structure has a first sidewall and a second sidewall opposite to the first sidewall, the first sidewall is under the merged portion, and the first sidewall is steeper than the second sidewall with respect to a top surface of the base.

In accordance with some embodiments, a semiconductor device structure is provided. The semiconductor device structure includes a substrate having a base, a first fin, and a second fin over the base. The semiconductor device structure includes a gate stack wrapped around top portions of the first fin and the second fin. The semiconductor device structure includes a first source/drain structure and a second source/drain structure over the first fin and the second fin respectively. The first source/drain structure is connected to the second source/drain structure, the first source/drain structure has a first sidewall and a second sidewall opposite to the first sidewall, the first sidewall faces the second source/drain structure, and the first sidewall is steeper than the second sidewall with respect to a top surface of the base.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

providing a substrate having a base, a first fin, and a second fin over the base;
forming a gate stack over the first fin and the second fin;
forming a first spacer over gate sidewalls of the gate stack and a second spacer adjacent to the second fin;
partially removing the first fin and the second fin, which are not covered by the gate stack and the first spacer, to form a first trench in the first fin and a second trench in the second fin; and
forming a first source/drain structure and a second source/drain structure in the first trench and the second trench respectively, wherein
a first upper edge of the first source/drain structure and a second upper edge of the second source/drain structure are merged to form a first merged portion of the first source/drain structure and the second source/drain structure, a first ratio of a first height of the first merged portion to a second height of a first top surface of the first source/drain structure is greater than or equal to about 0.5, and the first height and the second height are defined with respect to a second top surface of the second spacer.

2. The method for forming the semiconductor device structure as claimed in claim 1, wherein a second ratio of the first height of the first merged portion to a third height of a third top surface of the second source/drain structure is greater than or equal to about 0.5, and the third height is defined with respect to the second top surface of the second spacer.

3. The method for forming the semiconductor device structure as claimed in claim 1, wherein there is a gap, which is under the first merged portion and between the first source/drain structure and the second source/drain structure, and a length of the gap is greater than a width of the gap in a cross-sectional view of the first source/drain structure, the second source/drain structure, and the second spacer.

4. The method for forming the semiconductor device structure as claimed in claim 1, wherein the first source/drain structure has a first sidewall and a second sidewall, the first sidewall faces the second source/drain structure, the second sidewall faces away from the second source/drain structure, and the first sidewall is asymmetrical to the second sidewall with respect to the first fin.

5. The method for forming the semiconductor device structure as claimed in claim 4, wherein the second sidewall is a curved sidewall.

6. The method for forming the semiconductor device structure as claimed in claim 4, wherein a first absolute value of a first slope of the first sidewall is different from a second absolute value of a second slope of the second sidewall.

7. The method for forming the semiconductor device structure as claimed in claim 6, wherein the first absolute value of the first slope of the first sidewall is greater than the second absolute value of the second slope of the second sidewall.

8. The method for forming the semiconductor device structure as claimed in claim 1, wherein the first height of the first merged portion is greater than a thickness of the first merged portion.

9. The method for forming the semiconductor device structure as claimed in claim 1, wherein the forming of the first source/drain structure and the second source/drain structure in the first trench and the second trench respectively comprises:
performing an epitaxial process using a gas, wherein the gas comprises hydrogen.

10. The method for forming the semiconductor device structure as claimed in claim 1, wherein the substrate further has a third fin, the second fin is between the first fin and the third fin, the gate stack is further formed over the third fin, the partially removing of the first fin and the second fin further comprises partially removing the third fin, which is not covered by the gate stack and the first spacer, to form a third trench in the third fin, and the method further comprises:
forming a third source/drain structure in the third trench, wherein a third upper edge of the second source/drain structure and a fourth upper edge of the third source/drain structure are merged to form a second merged portion of the second source/drain structure and the third source/drain structure.

11. The method for forming the semiconductor device structure as claimed in claim 10, wherein the second source/drain structure is substantially symmetric laterally with respect to the second fin.

12. A method for forming a semiconductor device structure, comprising:
providing a substrate having a base, a first fin, and a second fin over the base;
forming a first nanostructure stack and a second nanostructure stack over the first fin and the second fin respectively, wherein the first nanostructure stack comprises a first nanostructure and a second nanostructure, and the second nanostructure stack comprises a third nanostructure and a fourth nanostructure;
forming a gate stack over the first nanostructure stack, the second nanostructure, the first fin, and the second fin;
partially removing the first nanostructure stack, the second nanostructure stack, the first fin, and the second fin, which are not covered by the gate stack, to form a first trench in the first nanostructure stack and the first fin and a second trench in the second nanostructure stack and the second fin;
removing end portions of the first nanostructure and the third nanostructure through the first trench and the second trench to form a first recess and a second recess in the first nanostructure stack and the second nanostructure stack respectively; and
forming a first source/drain structure and a second source/drain structure in the first trench and the second trench respectively, wherein
a first upper edge of the first source/drain structure and a second upper edge of the second source/drain structure are merged to form a merged portion of the first source/drain structure and the second source/drain structure, the first source/drain structure has a first sidewall and a second sidewall opposite to the first sidewall, the first sidewall is under the merged portion, and the first sidewall is steeper than the second sidewall with respect to a top surface of the base.

13. The method for forming the semiconductor device structure as claimed in claim 12, wherein the second sidewall is a curved surface.

14. The method for forming the semiconductor device structure as claimed in claim 12, wherein the second source/drain structure has a third sidewall facing the first source/drain structure, and the third sidewall is steeper than the second sidewall with respect to the top surface of the base.

15. The method for forming the semiconductor device structure as claimed in claim 14, wherein the second source/drain structure has a fourth sidewall opposite to the third sidewall, and the third sidewall is steeper than the fourth sidewall with respect to the top surface of the base.

16. A semiconductor device structure, comprising:
- a substrate having a base, a first fin, and a second fin over the base;
- a gate stack wrapped around top portions of the first fin and the second fin; and
- a first source/drain structure and a second source/drain structure over the first fin and the second fin respectively, wherein the first source/drain structure is connected to the second source/drain structure, the first source/drain structure has a first sidewall and a second sidewall opposite to the first sidewall, the first sidewall faces the second source/drain structure, and the first sidewall is steeper than the second sidewall with respect to a top surface of the base.

17. The semiconductor device structure as claimed in claim 16, wherein the second source/drain structure has a third sidewall facing the first source/drain structure, and the third sidewall is steeper than the second sidewall with respect to the top surface of the base.

18. The semiconductor device structure as claimed in claim 17, wherein the second source/drain structure has a fourth sidewall opposite to the third sidewall, and the third sidewall is steeper than the fourth sidewall with respect to the top surface of the base.

19. The semiconductor device structure as claimed in claim 18, wherein the fourth sidewall is a curved surface.

20. The semiconductor device structure as claimed in claim 16, wherein the second sidewall is a curved surface.

\* \* \* \* \*